(12) United States Patent
Pang et al.

(10) Patent No.: US 9,812,462 B1
(45) Date of Patent: Nov. 7, 2017

(54) MEMORY HOLE SIZE VARIATION IN A 3D STACKED MEMORY

(71) Applicant: SanDisk Technologies LLC, Plano, TX (US)

(72) Inventors: Liang Pang, Fremont, CA (US); Ashish Baraskar, Santa Clara, CA (US); Yanli Zhang, San Jose, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/175,304

(22) Filed: Jun. 7, 2016

(51) Int. Cl.
*H01L 29/792* (2006.01)
*H01L 27/11582* (2017.01)
*H01L 21/28* (2006.01)
*H01L 27/1157* (2017.01)

(52) U.S. Cl.
CPC .. *H01L 27/11582* (2013.01); *H01L 21/28282* (2013.01); *H01L 27/1157* (2013.01); *H01L 29/7926* (2013.01)

(58) Field of Classification Search
CPC .......... H01L 27/28282; H01L 27/1157; H01L 27/7926
See application file for complete search history.

(56) References Cited

U.S. PATENT DOCUMENTS

| | | | |
|---|---|---|---|
| 7,794,921 B2 | 9/2010 | Chen et al. | |
| 8,692,314 B2 | 4/2014 | Lee et al. | |
| 8,902,661 B1 | 12/2014 | Raghu et al. | |
| 8,982,626 B2 | 3/2015 | Dong et al. | |
| 9,343,156 B1 | 5/2016 | Mui et al. | |
| 2005/0063237 A1* | 3/2005 | Masuoka | H01L 27/115 365/324 |
| 2009/0230449 A1 | 9/2009 | Sakaguchi et al. | |
| 2009/0310425 A1* | 12/2009 | Sim | H01L 27/11526 365/185.29 |
| 2011/0199833 A1 | 8/2011 | Shim et al. | |
| 2013/0028027 A1 | 1/2013 | Kim et al. | |
| 2014/0239376 A1* | 8/2014 | Zhang | H01L 29/7827 257/324 |
| 2014/0362645 A1 | 12/2014 | Dong et al. | |
| 2015/0194435 A1* | 7/2015 | Lee | H01L 27/11575 257/329 |
| 2016/0071870 A1 | 3/2016 | Minami et al. | |

* cited by examiner

*Primary Examiner* — Marc Armand
*Assistant Examiner* — Wilner Jean Baptiste
(74) *Attorney, Agent, or Firm* — Vierra Magen Marcus LLP

(57) ABSTRACT

Techniques are provided for fabricating a memory device in which the memory cells have a uniform program and erase speed. In one aspect, a memory device is provided with memory holes having diameters which become progressively smaller as a distance between the memory holes and a local interconnect become progressively larger. In another aspect, a fabrication process is provided for such a memory device. The memory holes which are relatively closer to the local interconnect have a relatively thinner blocking oxide layer due to etching used to remove a sacrificial material of the control gate layers. The increased diameter compensates for the thinner blocking oxide layer.

11 Claims, 29 Drawing Sheets

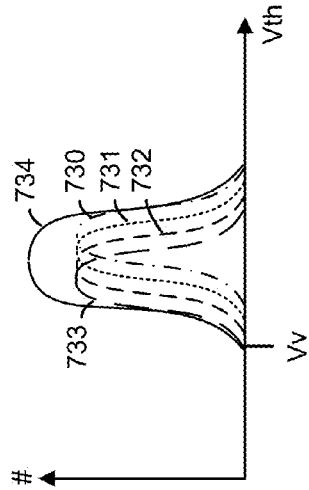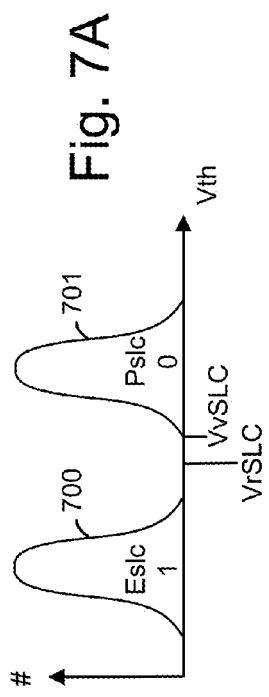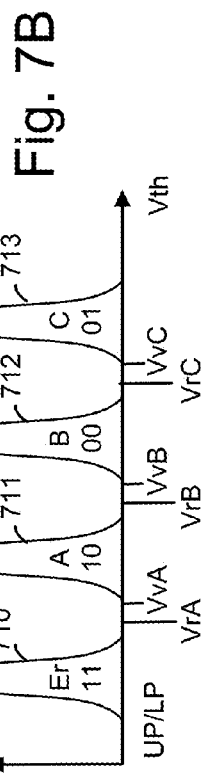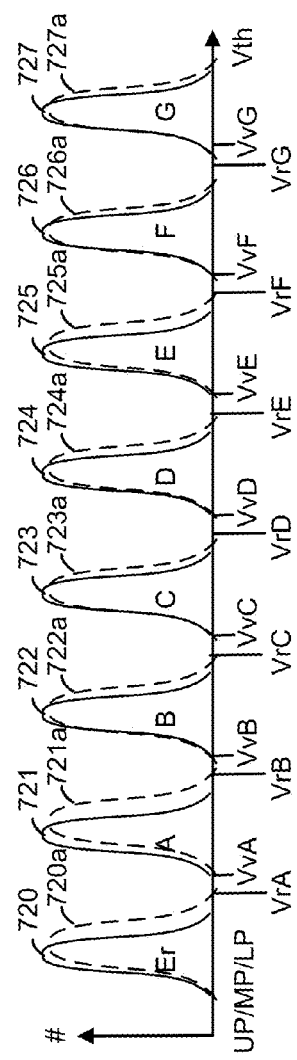

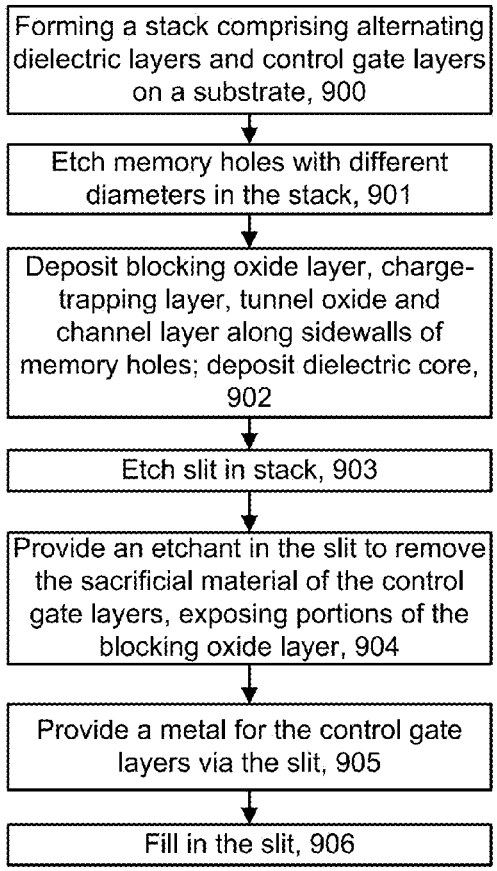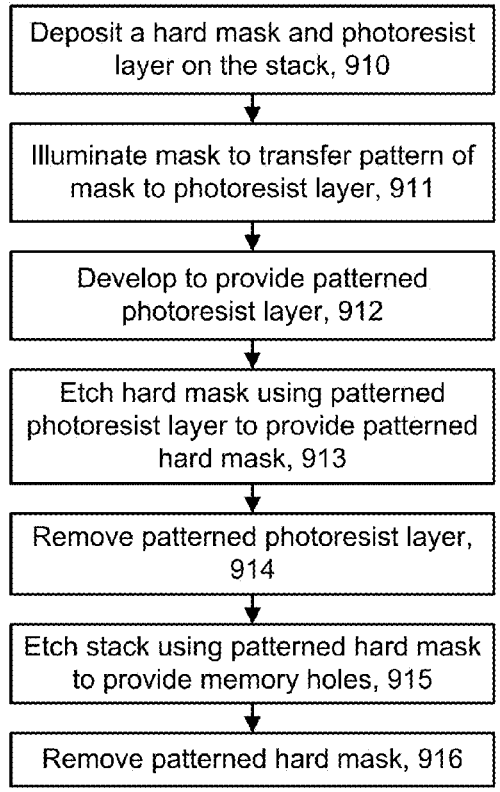

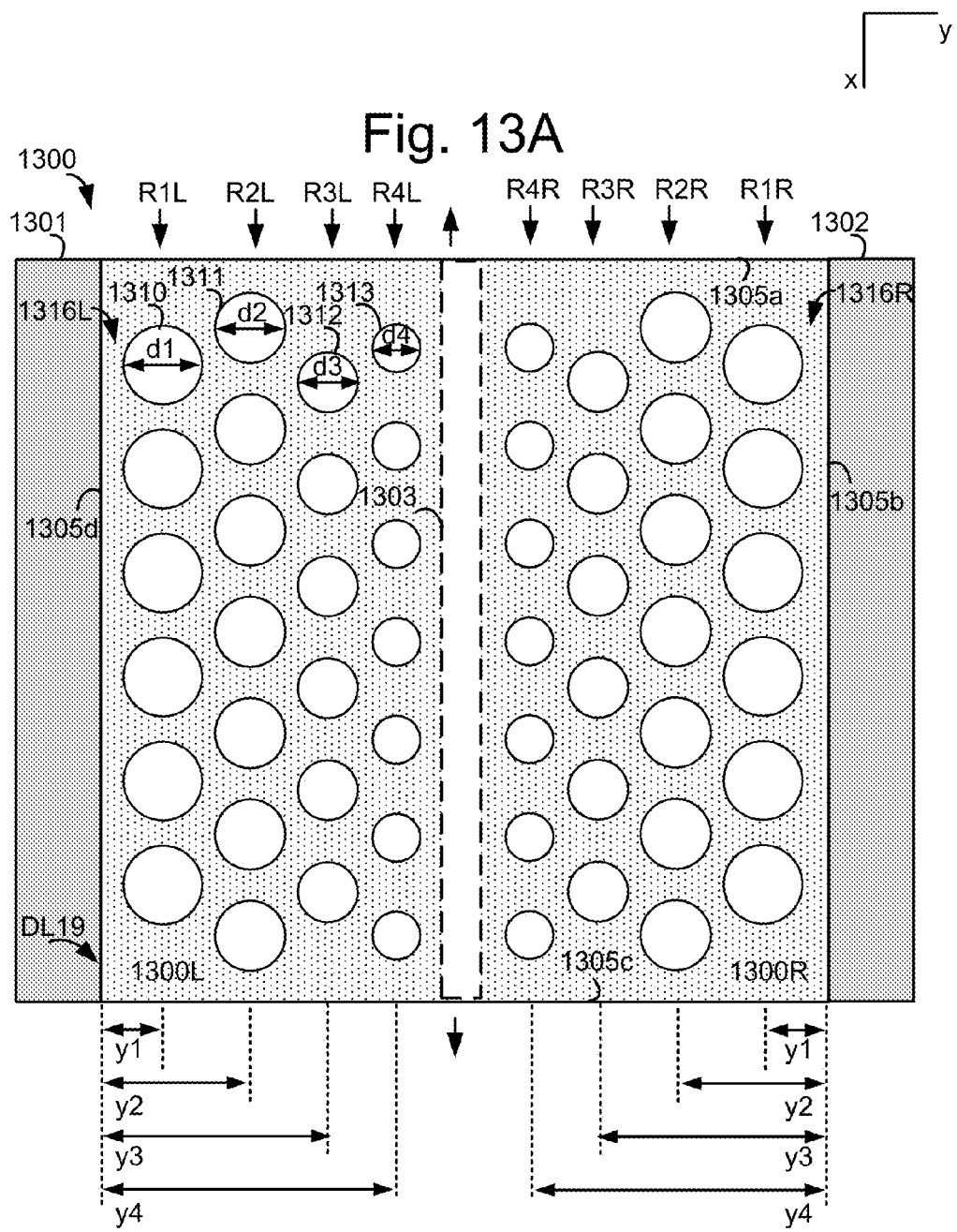

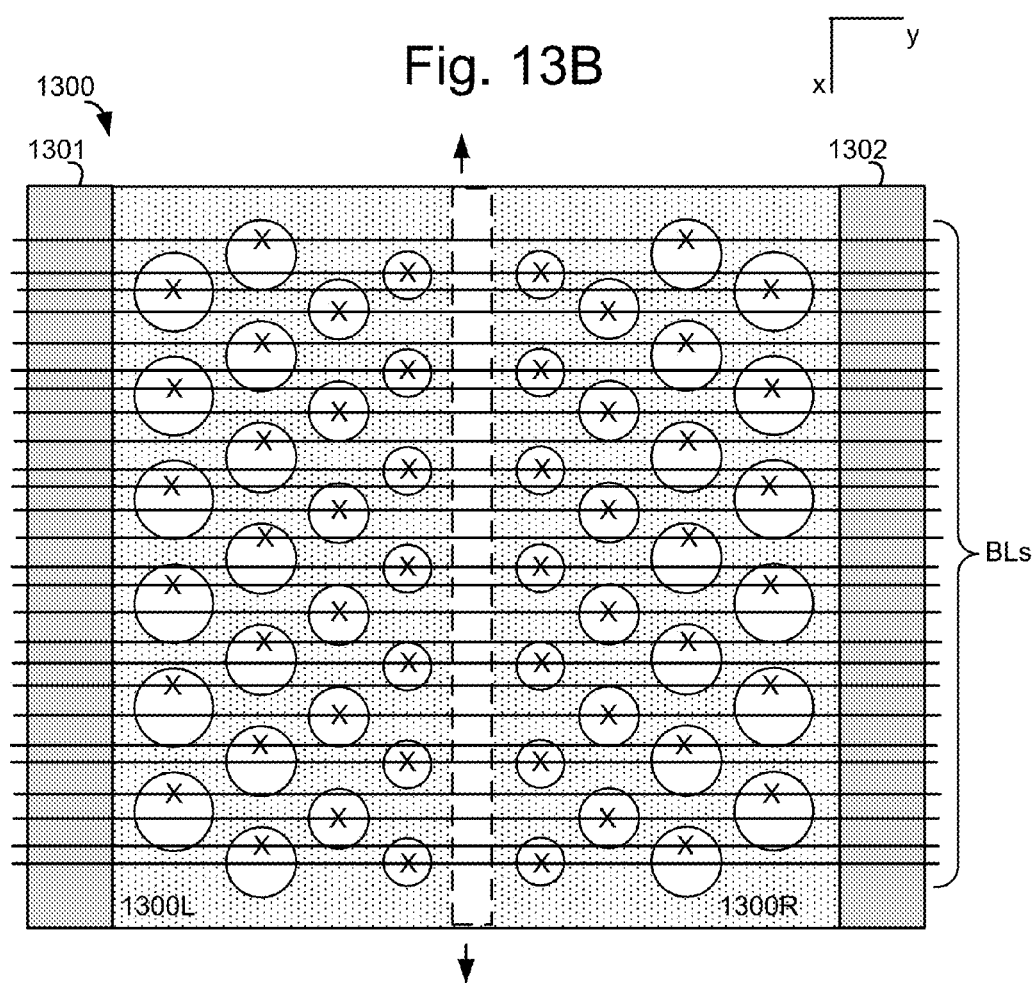

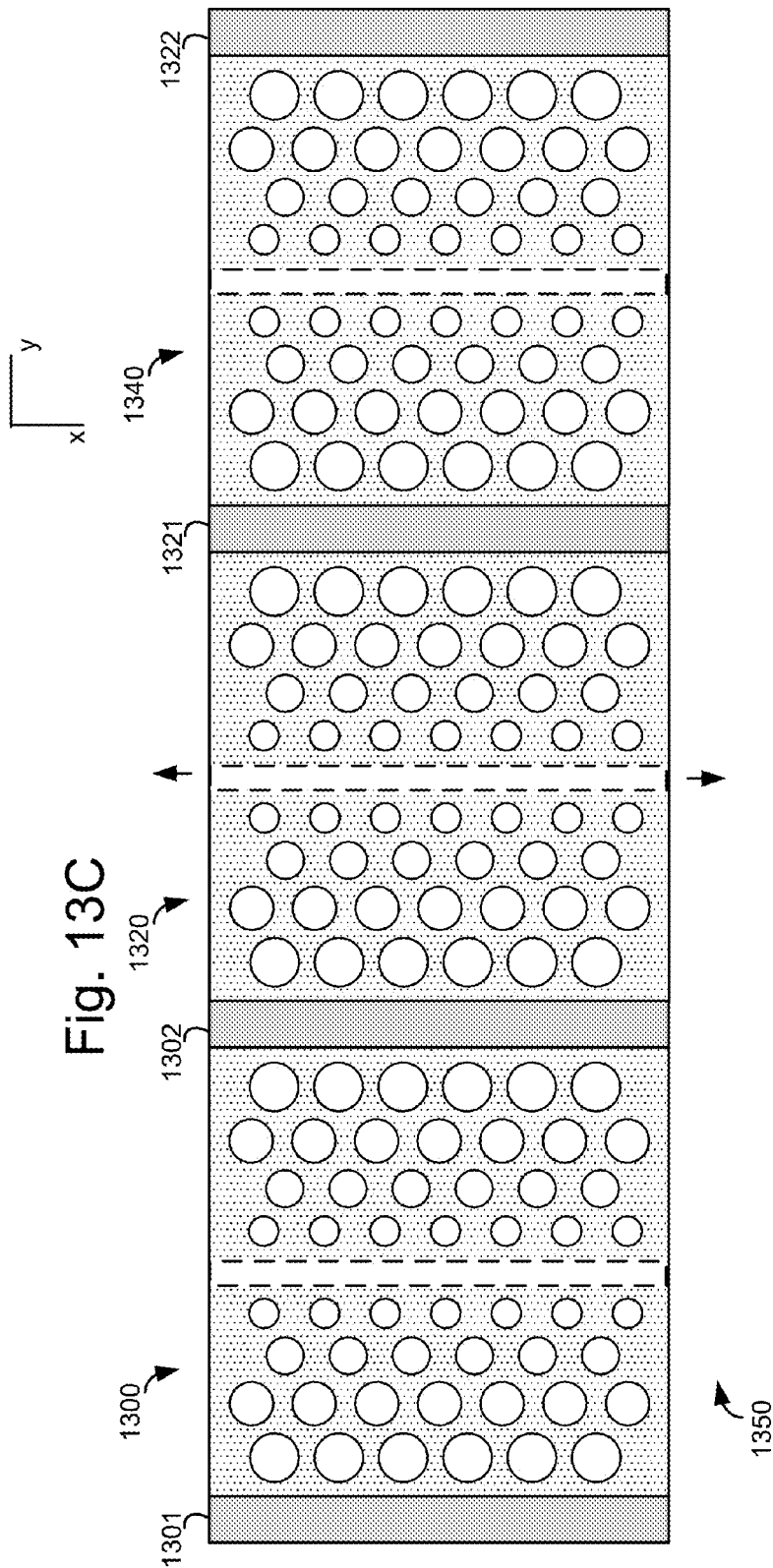

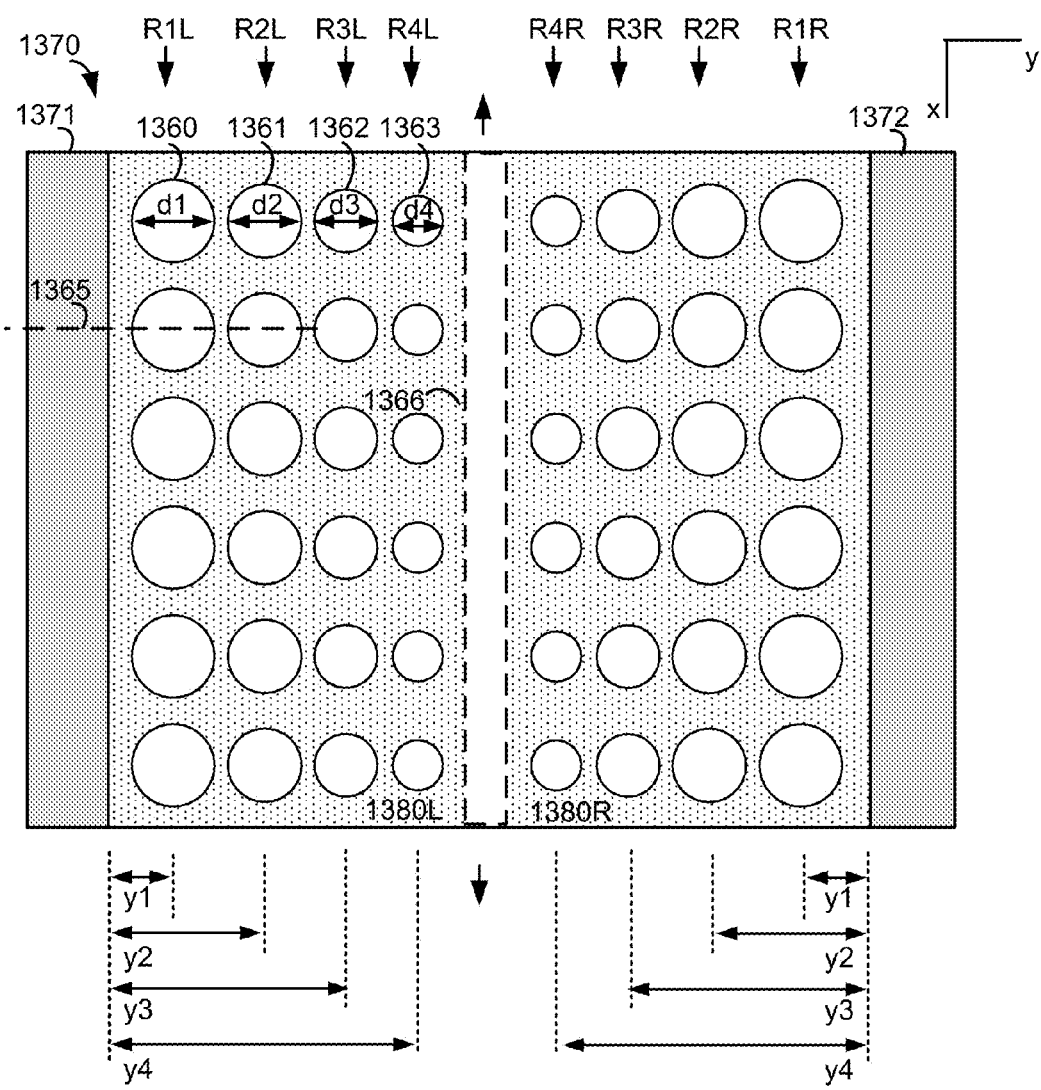

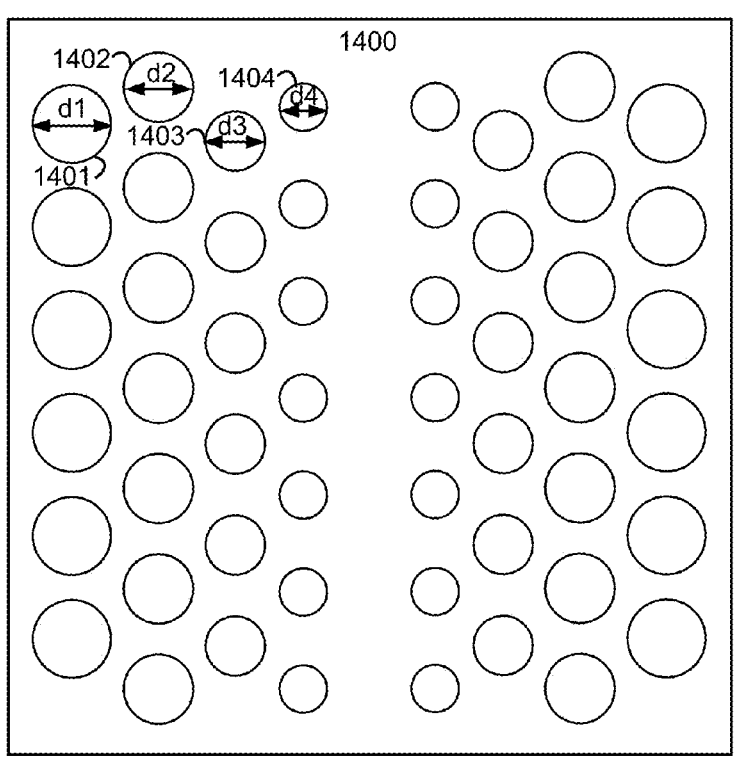
Fig. 14A
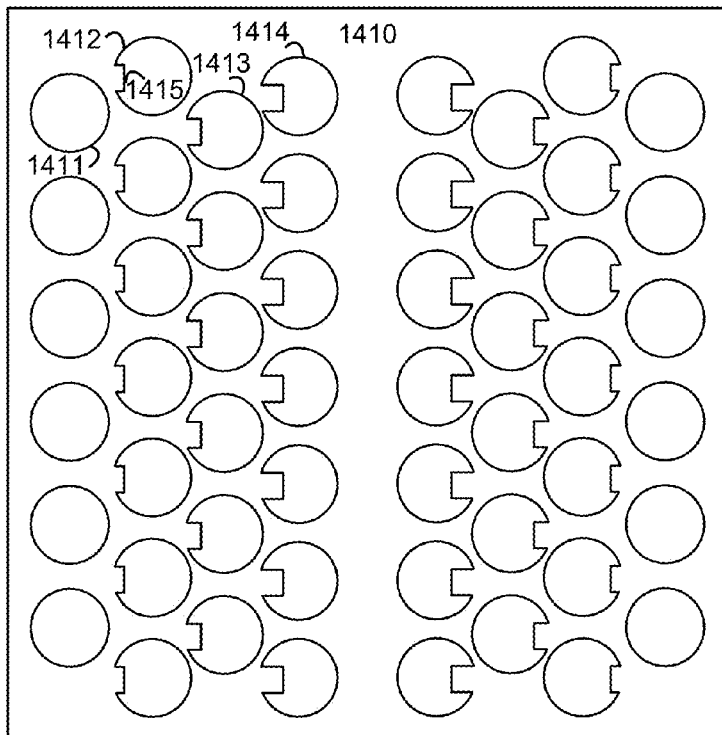
Fig. 14B
Fig. 14C
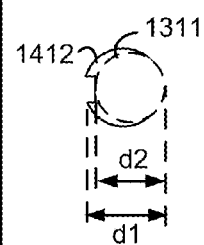

MEMORY HOLE SIZE VARIATION IN A 3D STACKED MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 7A depicts example Vth distributions of memory cells, where two data states are used.

FIG. 7B depicts example Vth distributions of memory cells, where four data states are used.

FIG. 7C depicts example Vth distributions of memory cells, where eight data states are used.

FIG. 7D depicts example distributions of memory cells with different programming speeds and different distances from a slit, after a program voltage is applied.

FIG. 9A depicts an example process for fabricating a memory device with memory holes having different diameters.

FIG. 9B depicts an example process for etching memory holes having different diameters, consistent with step 901 of FIG. 9A.

FIG. 13A depicts an example top view of a memory device consistent with FIG. 4 and FIG. 9A to 9C, where the memory holes have diameters which are inversely proportional to a distance from a local interconnect, and the memory holes are in staggered rows.

FIG. 13B depicts example bit line connections in the top view of a memory device of FIG. 13A.

FIG. 13C depicts a top view of a memory device in which the pattern of FIG. 13A is repeated.

FIG. 13D depicts an example top view of a memory device consistent with FIG. 4 and FIG. 9A to 9C, where the memory holes have diameters which are inversely proportional to a distance from a local interconnect, and the memory holes are in aligned rows.

FIG. 14A depicts an example of a photomask for use in providing the memory device of FIG. 13A, where the openings in the photomask have diameters which are inversely proportional to a distance of the corresponding memory holes from a local interconnect.

FIG. 14B depicts an example of a photomask for use in providing the memory device of FIG. 13A, where the openings in the photomask are circular and have edge modifications based on a distance from a local interconnect.

FIG. 14C depicts the opening 1412 of FIG. 14B overlaid with a corresponding memory hole 1311 of FIG. 13A.

DETAILED DESCRIPTION

Figure 1:
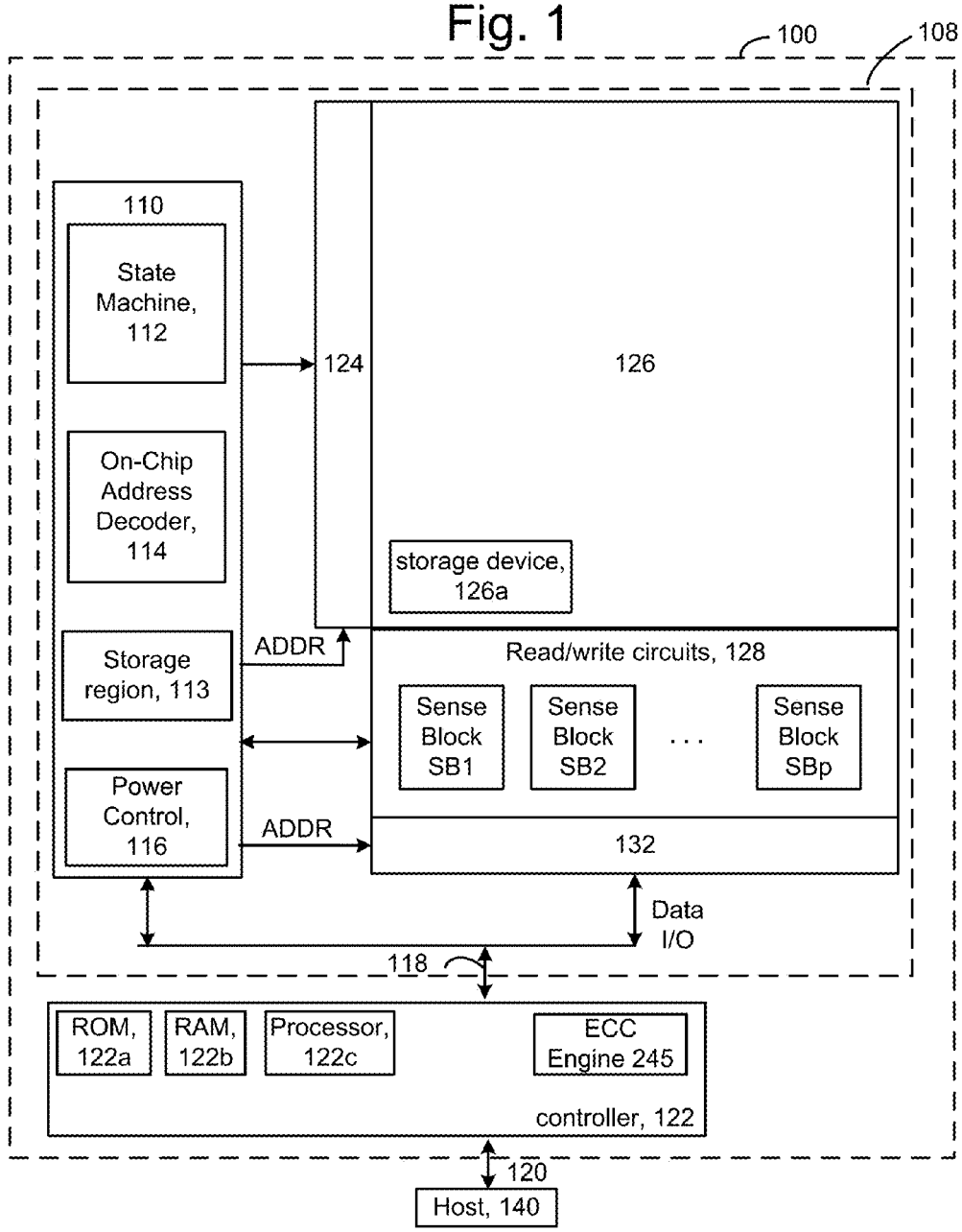
FIG. 1 is a block diagram of an example memory device.

Techniques are provided for fabricating a memory device in which the memory cells have a uniform program and erase speed. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state (Eslc) and the programmed state (Pslc) (see FIG. 7A). In a two-bit per cell memory device, there are four data states including the erased state and three higher data states referred to as the A, B and C data states (see FIG. 7B). In a three-bit per cell memory device, there are eight data states including the erased state and seven higher data states referred to as the A, B, C, D, E, F and G data states (see FIG. 7C). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

In one approach, the memory device comprises a stack of alternating conductive and dielectric layers, where the conductive layers form word lines or control gates of memory cells. The memory cells may be in strings which extend vertically in memory holes in the stack. Further, the memory cells may be formed by an annular layers of blocking oxide, charge-trapping material, tunnel oxide and channel polysilicon which extend in the stack. The layers may be arranged concentrically are a dielectric core. The layers and dielectric core form a pillar in the memory hole. When a program voltage is applied to a one of the word lines, and a pass voltage is applied to unselected word lines, an electric field is created which draws electrons from the channel layer into a portion of the charge-trapping material which is adjacent to the word line. When the amount of charge corresponds to a desired data state, the programming is completed.

However, the thickness of the blocking oxide layer can vary for different memory holes. In particular, when the control gate layers are formed, they may initially include a sacrificial material. Subsequently, after the memory holes are formed and filled with various layers, the sacrificial material may be removed from the stack using an etchant to create a void. The voids are then filled with metal to provide low-resistance control gates. The etchant is typically introduced in a slit which is formed in the stack, where the memory holes are in rows at different distances from the slit. After the sacrificial material is removed and the metal is deposited to form the control gates, an insulating liner is provided in the slit and the slit may be filled with metal to form a local interconnect which extends from the bottom of the stack, at the substrate, to the top of the stack. When the sacrificial material is etched away, the blocking oxide layers in the memory holes are exposed to the etchant and can be etched, reducing their thickness. This etching can occur even though the etchant is more selective of the sacrificial material, e.g., SiN, than the blocking oxide, e.g., SiO2.

Moreover, the blocking oxide layers in the memory holes which are closer to the slit are subject to the etching effects of the etchant for a longer period of time than the blocking oxide layers in the memory holes which are further from the slit. As a result, the blocking oxide layers in the memory holes which are closer to the slit become thinner than the blocking oxide layers in the memory holes which are further from the slit. The program and erase speed become faster when the blocking oxide layer become thinner. Due to the different blocking oxide thicknesses, the memory cells have different program and erase speeds. This results in problems such as a wider natural Vth distribution and increased program disturb.

Techniques provided herein address the above and other issues. In one aspect, a memory device is provided with memory holes having diameters which become progressively smaller as a distance between the memory holes and a local interconnect become progressively larger. The local interconnect represents the location from which an etchant was introduced to remove the sacrificial material of the control gate layers. The memory holes which are relatively closer to the local interconnect have a relatively thinner blocking oxide layer. In another aspect, a fabrication process is provided for such a memory device.

Various other features and benefits are described below.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for program and read parameters as described further below.

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein. For example, a control circuit may include any one of, or a combination of, control circuitry 110, state machine 112, decoders 114 and 132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors.

The storage device comprises code such as a set of instructions, and the processor is operable to execute the set of instructions to provide functions such as programming, reading and erasing. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform functions such as programming, reading and erasing.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
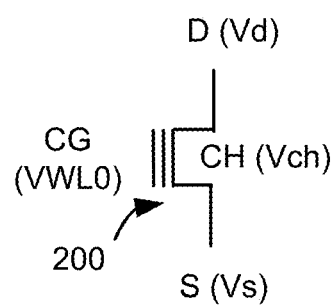
FIG. 2 depicts an example memory cell 200.

FIG. 2 depicts an example memory cell 200. The memory cell comprises a control gate CG which receives a word line voltage Vwll0, a drain at a voltage Vd, a source at a voltage Vs and a channel at a voltage Vch.

Figure 3:
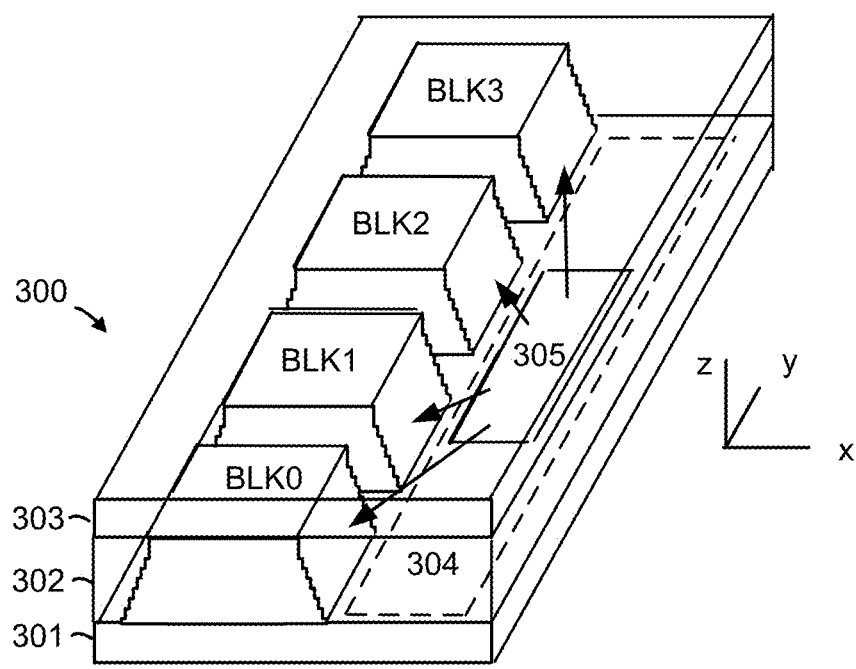
FIG. 3 is a perspective view of a memory device 300 comprising a set of blocks in an example 3D configuration of the memory structure 126 of FIG. 1.

FIG. 3 is a perspective view of a memory device 300 comprising a set of blocks in an example 3D configuration of the memory structure 126 of FIG. 1. On the substrate are example blocks BLK0, BLK1, BLK2 and BLK3 of memory cells (storage elements) and a peripheral area 304 with circuitry for use by the blocks. For example, the circuitry can include voltage drivers 305 which can be connected to control gate layers of the blocks. In one approach, control gate layers at a common height in the blocks are commonly driven. The substrate 301 can also carry circuitry under the blocks, along with one or more lower metal layers which are patterned in conductive paths to carry signals of the circuitry. The blocks are formed in an intermediate region 302 of the memory device. In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
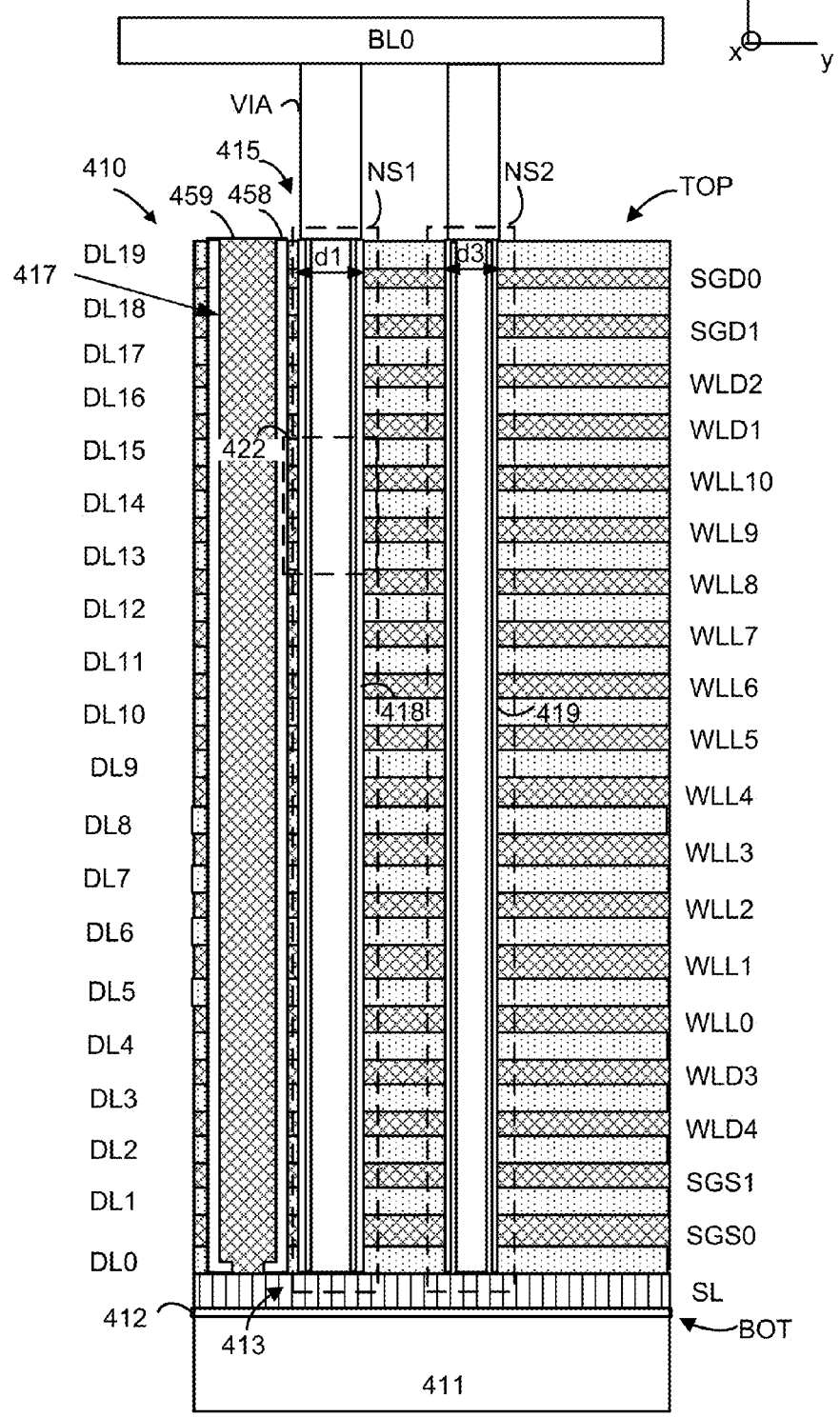
FIG. 4 depicts an example cross-sectional view of a portion of one of the blocks of FIG. 3.

FIG. 4 depicts an example cross-sectional view of a portion of one of the blocks of FIG. 3. The cross-sectional view is taken along line 1365 in FIG. 13D. The block comprises a stack 410 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 418 or 419 which is filled with materials which form memory cells adjacent to the word lines. A region 422 of the stack is shown in greater detail in FIG. 6. The memory holes may have different diameters, as mentioned. For example, the memory holes 418 and 419 have diameter d1 and d3, respectively, where d1>d3. The diameters are taken at a top of the memory holes, as an example.

The stack includes a substrate 411, an insulating film 412 on the substrate, and a portion of a source line SL. NS1 has a source-end 413 at a bottom (BOT) of the stack and a drain-end 415 at a top (TOP) of the stack. Metal-filled slits may be provided periodically across the stack as interconnects, e.g., local interconnect 417, which extend through the stack, such as to connect the source line to a line above the stack. The slits may be used during the formation of the word lines and subsequently filled with metal. The interconnect includes an insulating liner 458, e.g., SiO2, and a metal 459, e.g., W. A portion of a bit line BL0 is also depicted. A conductive via (VIA) connects the drain-end 415 to BL0.

Figure 5:
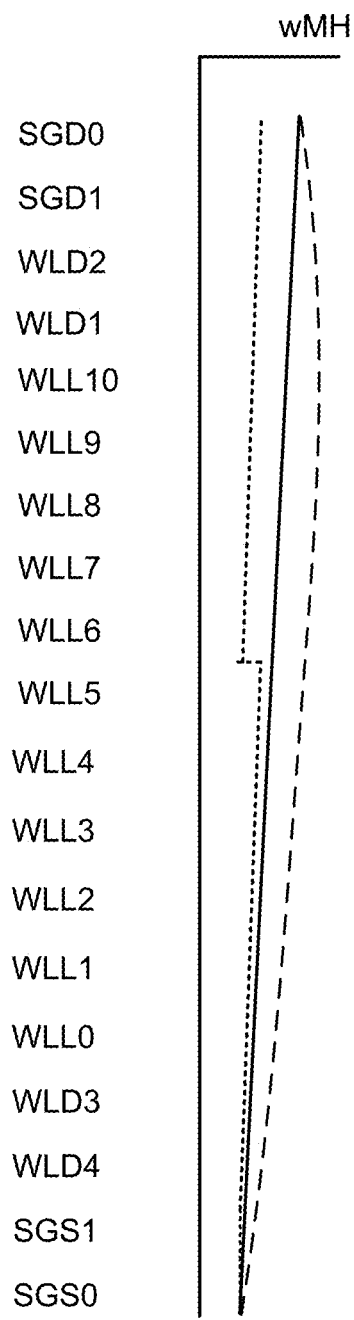
FIG. 5 depicts a plot of memory hole diameter in the stack of FIG. 4.

FIG. 5 depicts a plot of memory hole diameter in the stack of FIG. 4. The vertical axis is aligned with the stack of FIG. 4 and depicts a width (wMH), e.g., diameter, of the pillars formed by materials in the memory holes. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher. This variation is in addition to the variation caused by different thicknesses of the blocking oxide layer.

In another possible implementation, represented by the short dashed line, the stack is fabricated in two tiers. The stack can be fabricated in two or more tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top. See also FIG. 12A to 12D.

Figure 6:
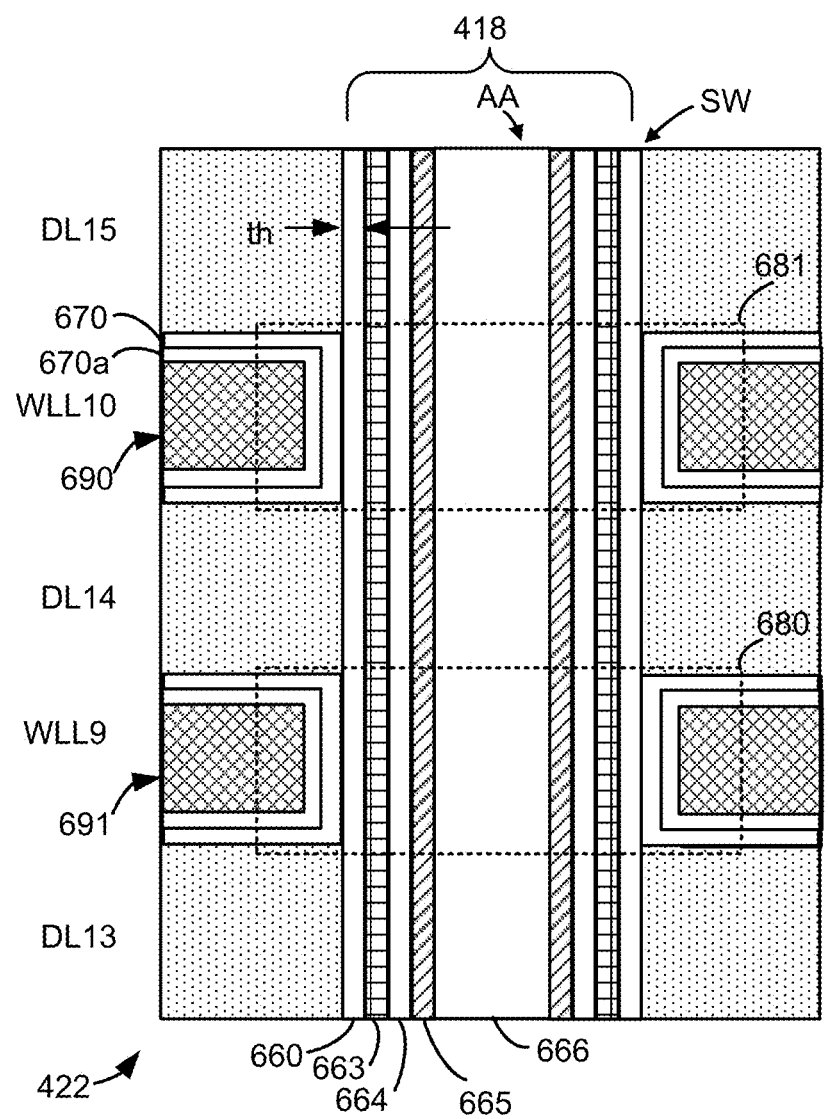
FIG. 6 depicts a close-up view of the region 422 of the stack of FIG. 4.

FIG. 6 depicts a close-up view of the region 422 of the stack of FIG. 4. Memory cells are formed at the different levels of the stack at the intersection of a word line layer and a memory hole. For example, memory cells 680 and 681 are formed in WLL9 and WLL10, respectively. The memory cells are formed from films which are deposited along the sidewall (SW) of the memory hole 418 and/or within each word line layer, e.g., using atomic layer deposition. For example, each column (e.g., the pillar which is formed by the materials within a memory hole) can include a blocking oxide layer 660, charge-trapping layer 663 such as SiN or other nitride, a tunneling oxide layer 664, a channel layer 665 (e.g., comprising polysilicon), and a dielectric core 666. The blocking oxide may comprises a continuous oxide layer such as silicon dioxide (SiO2) along the sidewall, in one approach. The blocking oxide serves to contain charges within the charge trapping layer during programming. The charge-trapping layer, tunneling oxide layer and channel may also comprise continuous layers along the sidewall, in one approach.

A word line layer can include a metal barrier 670a (e.g., TiN, TaN, a nitride based metal barrier layer or a non-nitride metal barrier layer such as Ti or CoW) and a conductive metal 662 (e.g., W, Co, Ti, Ru or Ta) as a control gate. For example, control gates 691 and 690 are provided in WLL9 and WLL10, respectively. A word line layer can also include a high-k blocking oxide 670 such as A10. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

The blocking oxide layer 660 is depicted as having a thickness th. This thickness can vary based on the distance of the memory hole to closest slit or local interconnect which was used to etch away the sacrificial material of the control gate layers.

As shown, each of the memory holes can be filled with a plurality of annular layers comprising a blocking oxide layer, a charge-trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

In FIG. 7A to 7C, the vertical axis depicts a numbers of cells on a logarithmic sale and the horizontal axis depicts Vth on a linear scale.

FIG. 7A depicts example Vth distributions of memory cells, where two data states are used. During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

A Vth distribution 700 represents an erased state (Eslc) and a Vth distribution 701 represents a programmed data state (Pslc), in an example of single-level cell (SLC) programming. The erased state may represent a one bit while the programmed state represents a zero bit, for example. A verify voltage for the programmed state is VvSLC and a read voltage for distinguishing between the two states is VrSLC. Generally, a read voltage for distinguishing between adjacent states, e.g., a lower state and a higher state, should be located midway between the expected upper tail of the Vth distribution of the lower state and the expected lower tail of the Vth distribution of the higher state.

FIG. 7B depicts example Vth distributions of memory cells, where four data states are used. The data states are represented by Vth distributions 710, 711, 712 and 713 for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB.

FIG. 7C depicts example Vth distributions of memory cells, where eight data states are used. The verify voltages of the A, B, C, D, E, F and G states are VvA, VvB, VvC, VvD, VvE, VvF and VvG, respectively. A first set of read voltages for the A, B, C, D, E, F and G states includes VrA, VrB, VrC, VrD, VrE, VrF and VrG, respectively. For the A, B, C, D, E, F and G states, an example encoding of bits for each state is 111, 110, 100, 000, 010, 011, 001 and 101, respectively. The Vth distribution is relatively narrower for memory holes which are relatively far from the slit (e.g., Vth distributions 720, 721, 722, 723, 724, 725, 726 and 727 for the Er, A, B, C, D, E, F and G states, respectively) due to the slower programming of the wider blocking oxide layer, as mentioned, while the Vth distribution is relatively wider for memory holes which are relatively closer to the slit (e.g., Vth distributions 720a, 721a, 722a, 723a, 724a, 725a, 726a and 727a for the Er, A, B, C, D, E, F and G states, respectively) due to the faster programming of the narrower blocking oxide layer.

When the blocking oxide layer is relatively thinner, the distance between the control gate and the channel is relatively less. As a result, the magnitude of the gate-to-channel voltage is relatively greater so that programming and erase speed is relatively greater. When programming speed is relatively greater, the upper tail of the Vth distribution will be relatively higher. Moreover, this upshift will be less for memory cells in relatively higher data states due to the smaller amount of program disturb experienced by these memory cells.

FIG. 7D depicts example distributions of memory cells with different programming speeds and different distances from a slit, after a program voltage is applied. For the faster programming memory cells which are closer to the slit, the Vth distribution is relatively higher. The Vth distributions 730, 731, 732 and 733 are for cells with progressively increasing distances from the slit (e.g., the Vth distribution 730 is for cells closest to the slit and the Vth distribution 733 is for cells furthest from the slit). When there are multiple slits, the distance from the memory hole to the closest slit is relevant. For example, the rows of cells R1L, R2L, R3L and R4L in FIG. 13A which are at progressively increasing distances from the interconnect 1301 may have the Vth distributions 730, 731, 732 and 733, respectively. Similarly, the rows of cells R1R, R2R, R3R and R4R in FIG. 13A which are at progressively increasing distances from the interconnect 1302 may have the Vth distributions 730, 731, 732 and 733, respectively. The overall Vth distribution 734 is a sum of the component distributions, and is wider when there is a variation in programming speeds.

Figure 8A:
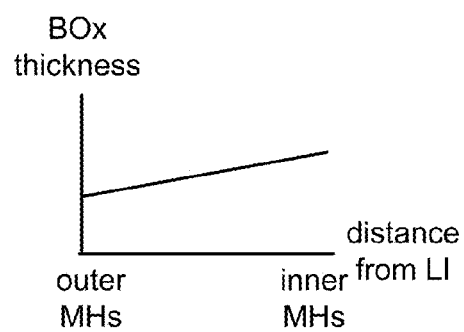
FIG. 8A depicts a plot of blocking oxide (BOx) thickness in a memory hole versus distance from a local interconnect.

FIG. 8A depicts a plot of blocking oxide (BOx) thickness in a memory hole (MH) versus distance from a local interconnect (LI). The horizontal depicts outer MHs, e.g., MHs of rows R1L and R1R in FIG. 13A, which are relatively close to the closest LI, and inner MHs, e.g., MHs of rows R4L and R4R in FIG. 13A, which are relatively far from the closest LI. As mentioned, the BOx thickness th is relatively smaller for the outer MHs. For each memory hole of a set of memory holes, such as in FIG. 13A, a width (th) of the blocking oxide layer is relatively smaller when the distance of the memory hole of the set of memory holes from the local interconnect is relatively smaller.

Figure 8B:
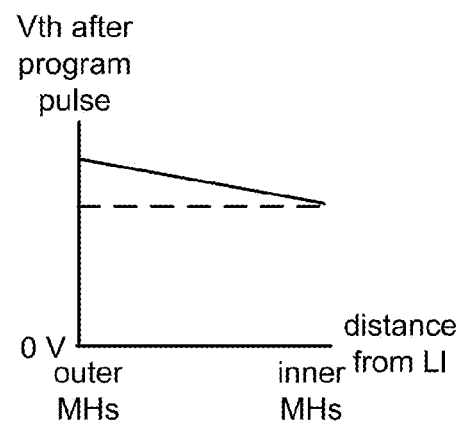
FIG. 8B depicts a plot of Vth after a program pulse for a memory cell versus distance from a local interconnect.

FIG. 8B depicts a plot of Vth after a program pulse for a memory cell versus distance from a local interconnect. The solid line represents the case of the inner and outer MHs having a common diameter. In this case, the Vth is relatively larger for the outer MHs, because the associated memory cells are relatively strongly programmed. The dashed line represents the case of the inner MHs having a smaller diameter than the outer MHs, e.g., as in FIG. 13A. In this case, the Vth is advantageously uniform across the different MHs. This results in the narrower Vth distributions 721-727 of FIG. 7C, for example.

Figure 8C:
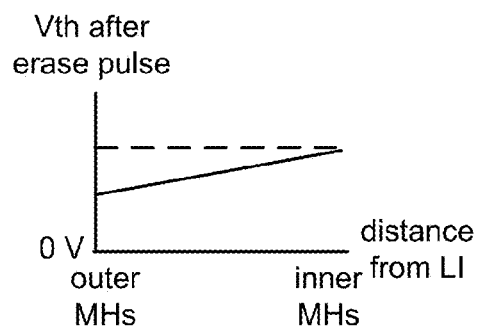
FIG. 8C depicts a plot of Vth after an erase pulse for a memory cell versus distance from a local interconnect.

FIG. 8C depicts a plot of Vth after an erase pulse for a memory cell versus distance from a local interconnect. The solid line represents the case of the inner and outer MHs having a common diameter. In this case, the Vth is relatively smaller for the outer MHs, because the associated memory cells are relatively deeply erased. The dashed line represents the case of the inner MHs having a smaller diameter than the outer MHs, e.g., as in FIG. 13A. In this case, the Vth is advantageously uniform across the different MHs. This results in the narrower Vth distribution 720 of FIG. 7C, for example.

Figure 8D:
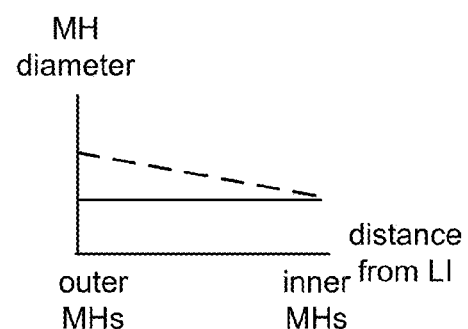
FIG. 8D depicts a plot of memory hole (MH) diameter versus distance from a local interconnect.

FIG. 8D depicts a plot of memory hole (MH) diameter versus distance from a local interconnect. The solid line represents the case of the inner and outer MHs having a common diameter. The dashed line represents the case of the inner MHs having a smaller diameter than the outer MHs, e.g., as in FIG. 13A. A larger memory hole diameter compensates for a smaller blocking oxide thickness. In particular, when the memory hole diameter increases, the electric field density across the tunnel oxide decreases. The program speed and erase speed therefore also decrease. This offsets the increase in the program speed and erase speed caused by the reduction in the blocking oxide thickness due to etching. Therefore, we can deliberately adjust the memory hole size to compensate for the different program and erase speeds of the memory holes which would otherwise occur when the memory holes are at different distances from a slit.

FIG. 9A depicts an example process for fabricating a memory device with memory holes having different diameters. Step 900 includes forming a stack comprising alternating dielectric layers and control gate layers on a substrate. In one approach, the control gate layers initially comprise a sacrificial material such as SiN. See, e.g., FIG. 10A. Step 901 includes etching memory holes with different diameters in the stack. See, e.g., FIG. 10B to 10D. Step 902 includes depositing, in turn, a blocking oxide layer, a charge-trapping layer, a tunnel oxide and a channel layer along the sidewalls of the memory holes. A dielectric core such as $SiO_2$ is also provided to fill a remainder of the memory holes. See, e.g., FIG. 10E. Step 903 includes etching a slit, e.g., an additional opening, in the stack. See, e.g., FIG. 10F. Step 904 includes providing an etchant in the slit to remove the sacrificial material of the control gate layers, exposing portions of the blocking oxide layer. See, e.g., FIG. 10G. For example, a wet etchant such as diluted hydrofluoric acid may be used. Step 905 includes providing a metal such as W for the control gate layer via the slit. See, e.g., FIG. 10H. Step 906 includes filling in the slit. See, e.g., FIG. 4.

FIG. 9B depicts an example process for etching memory holes having different diameters, consistent with step 901 of FIG. 9A. Step 910 includes depositing a hard mask and photoresist layer on the stack. See, e.g., FIG. 10A. Step 911 includes illuminating the mask to transfer a pattern of the mask to the photoresist layer. See, e.g., FIG. 10B. Step 912 includes developing the photoresist to provide a patterned photoresist layer. Step 913 includes etching the hard mask using the patterned photoresist layer to provide a patterned hard mask. See, e.g., FIG. 10C. Step 914 includes removing the patterned photoresist layer. Step 915 includes etching the stack using the patterned hard mask to provide memory holes. See, e.g., FIG. 10D. Step 916 includes removing the patterned hard mask.

Figure 9C:
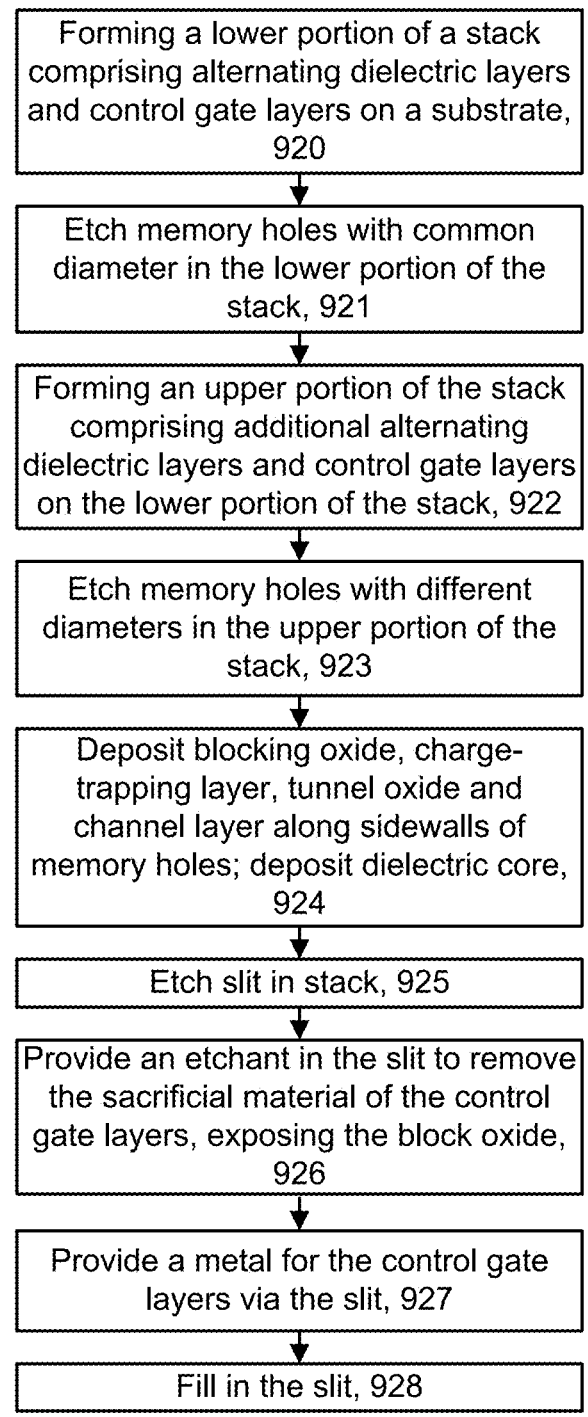
FIG. 9C depicts another example process for fabricating a memory device with memory holes having different diameters, in which lower and upper portions of a stack are etched separately.

FIG. 9C depicts another example process for fabricating a memory device with memory holes having different diameters, in which lower and upper portions of a stack are etched separately. In this example, the stack is fabricated in two parts—a lower portion follow by an upper portion. The process can be extended to fabrication in more than two portions.

Step 920 includes forming a lower portion of a stack comprising alternating dielectric layers and control gate layers on a substrate. See, e.g., FIG. 12A. Step 921 includes etching memory holes with a common diameter in the lower portion of the stack, in one approach. Another approach includes etching memory holes with different diameters in the lower portion of the stack. See, e.g., FIG. 12A. Step 922 includes forming an upper portion of the stack comprising alternating dielectric layers and control gate layers on the lower portion of the stack. See, e.g., FIG. 12B. Step 923 includes etching memory holes with different diameters in the upper portion of the stack. In one approach, the diameter is the same for the outer row of holes in the lower and upper portions. The memory holes in the lower and upper portions may be aligned such that continuous memory holes are formed which extend from a top to a bottom of the stack. See, e.g., FIG. 12C.

Step 924 includes depositing, in turn, a blocking oxide layer, a charge-trapping layer, a tunnel oxide and a channel layer along the sidewalls of the memory holes. A dielectric core is also provided to fill a remainder of the memory holes. See, e.g., FIG. 12D. Step 925 includes etching a slit in the stack. See, e.g., FIG. 10F. Step 926 includes providing an etchant in the slit to remove the sacrificial material (e.g., SiN) of the control gate layers, exposing portions of the blocking oxide layer. See, e.g., FIG. 10G. Step 927 includes providing a metal for the control gate layer via the slit. See, e.g., FIG. 10H. Step 928 includes filling in the slit. See, e.g., FIG. 4.

Figure 10A:
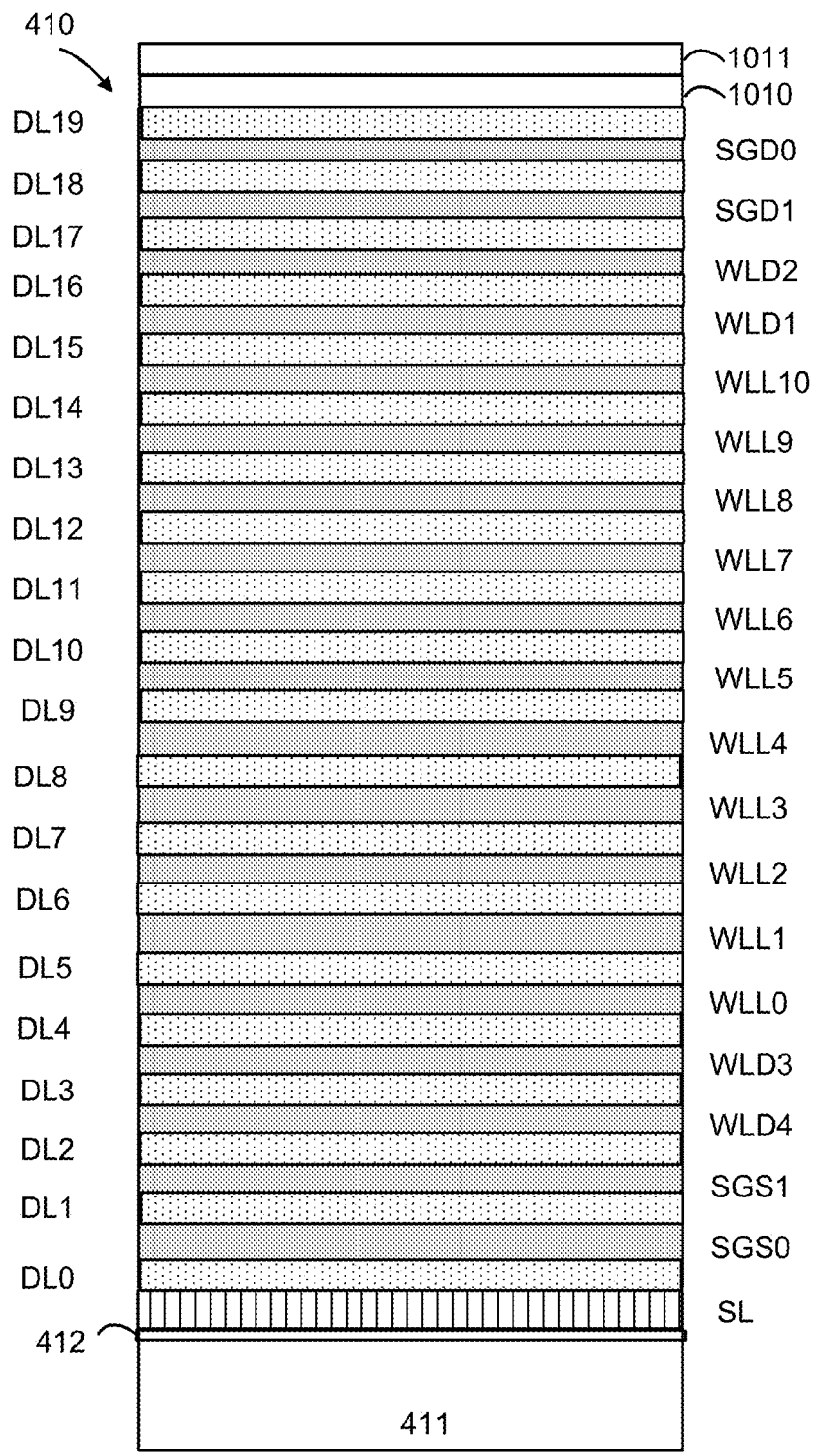
FIG. 10A depicts an example cross-sectional view of a stack of a memory device during a fabrication process consistent with step 900 of FIG. 9A, where the stack includes alternating dielectric and control gate layers.

FIG. 10A depicts an example cross-sectional view of a stack of a memory device during a fabrication process consistent with step 900 of FIG. 9A, where the stack includes alternating dielectric and control gate layers. Step 900 includes forming a stack comprising alternating dielectric layers and control gate layers on a substrate. The dielectric layers may comprise oxide and the control gate layers may comprise SiN, for example, at this stage. The stack includes a substrate 411 and an insulating film 412 on the substrate. A hard mask layer 1010 and a photoresist layer 1011 are also provided.

Figure 10B:
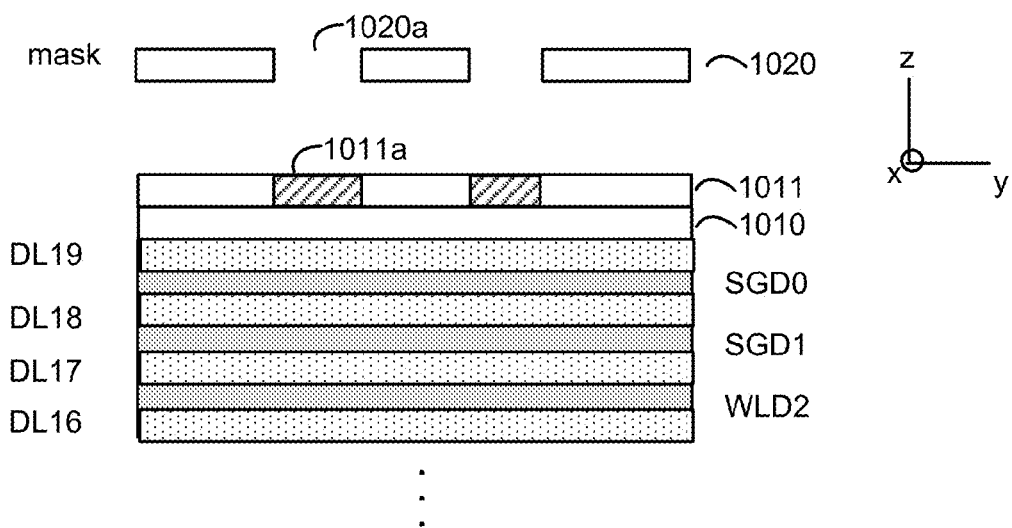
FIG. 10B depicts an example cross-sectional view of the stack of FIG. 10A after processing which is consistent with step 901 of FIG. 9A and steps 910 and 911 of FIG. 9B.

FIG. 10B depicts an example cross-sectional view of the stack of FIG. 10A after processing which is consistent with step 901 of FIG. 9A and steps 910 and 911 of FIG. 9B. Step 901 includes etching memory holes with different diameters in the stack. Step 910 includes depositing a hard mask and photoresist layer on the stack. Step 911 includes illuminating the mask to transfer a pattern of the mask to the photoresist layer. A photomask 1020 with openings 1020a is used to provide exposed regions, e.g., region 1011a, in the photoresist layer 1011. In the developing of the photoresist, the photoresist is washed in a development solution which removes the exposed regions of the photoresist (for a positive photoresist). A negative photoresist could alternatively be used.

Figure 10C:
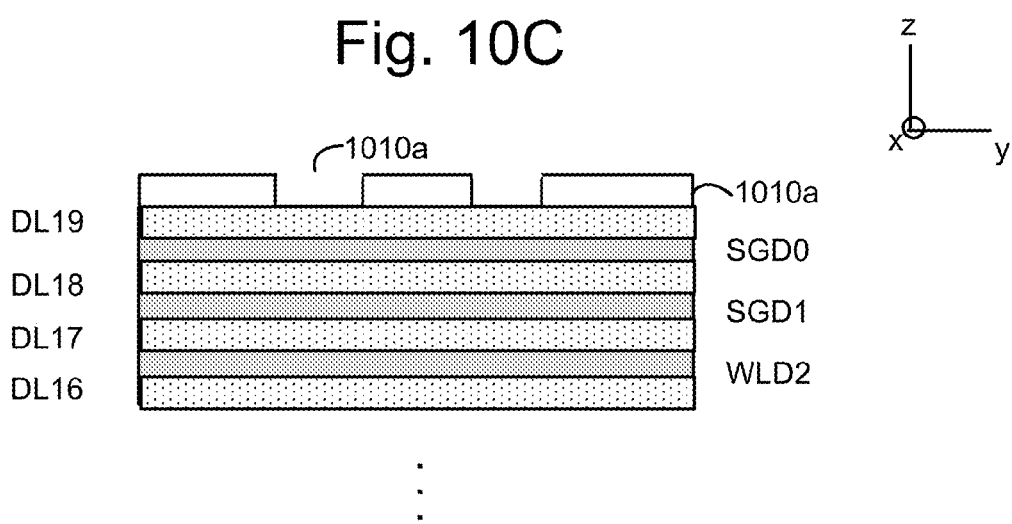
FIG. 10C depicts an example cross-sectional view of the stack of FIG. 10B after processing which is consistent with step 901 of FIG. 9A and steps 912 to 914 of FIG. 9B.

FIG. 10C depicts an example cross-sectional view of the stack of FIG. 10B after processing which is consistent with step 901 of FIG. 9A and steps 912 to 914 of FIG. 9B. Step 912 includes developing the photoresist to provide a patterned photoresist layer. Step 913 includes etching the hard mask using the patterned photoresist layer to provide a patterned hard mask. Step 914 includes removing the patterned photoresist layer. Once the exposed regions of the photoresist are removed, the photoresist layer becomes a mask which is used to pattern the hard mask layer, resulting in a patterned hard mask layer 1010a.

In FIGS. 10B and 10C, the bottom portion of the stack is not shown.

Figure 10D:
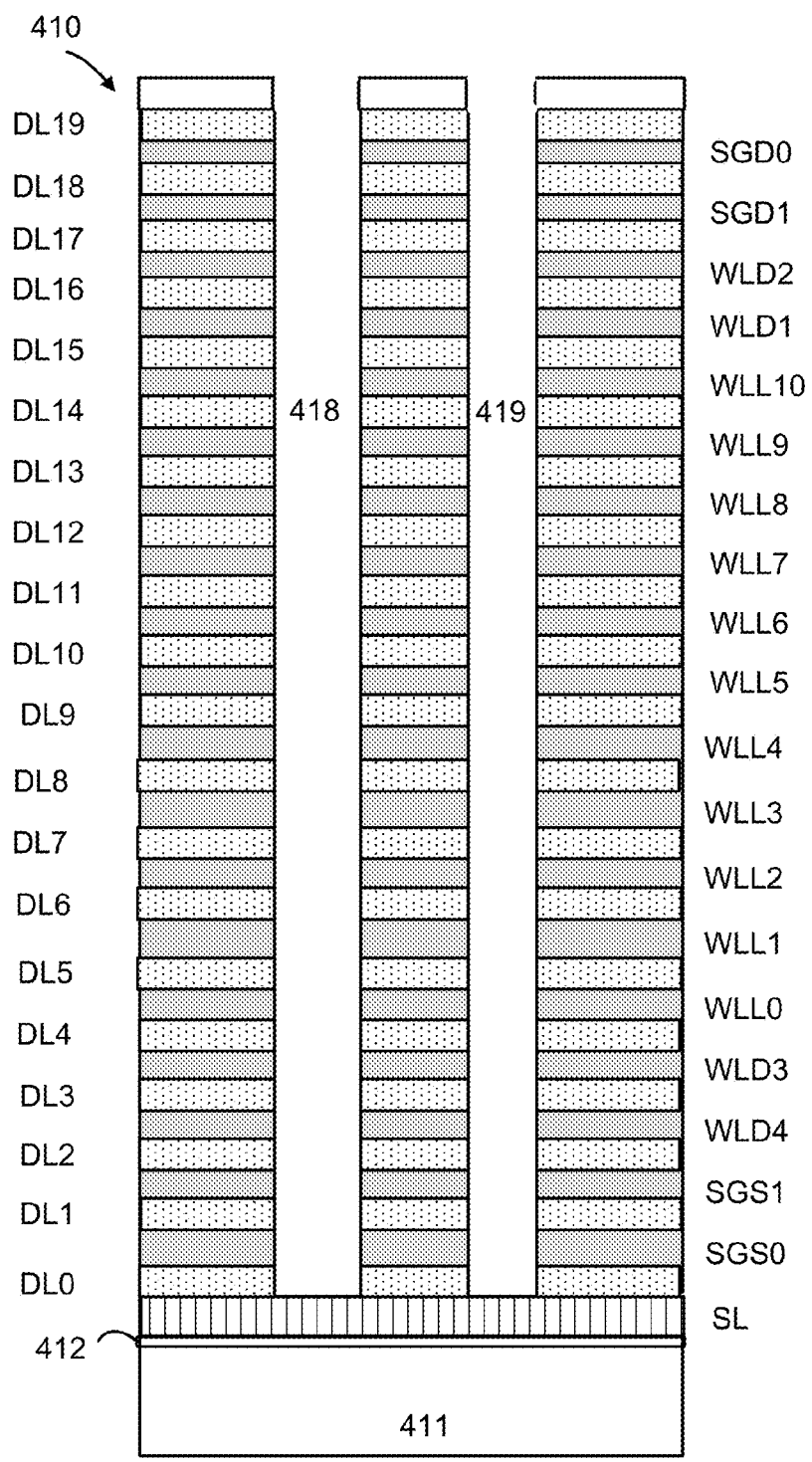
FIG. 10D depicts an example cross-sectional view of the stack of FIG. 10C after processing which is consistent with step 901 of FIG. 9A and step 915 of FIG. 9B.

FIG. 10D depicts an example cross-sectional view of the stack of FIG. 10C after processing which is consistent with step 901 of FIG. 9A and step 915 of FIG. 9B. Step 915 includes etching the stack using the patterned hard mask. The memory holes 418 and 419 are formed, consistent with FIG. 4.

Figure 10E:
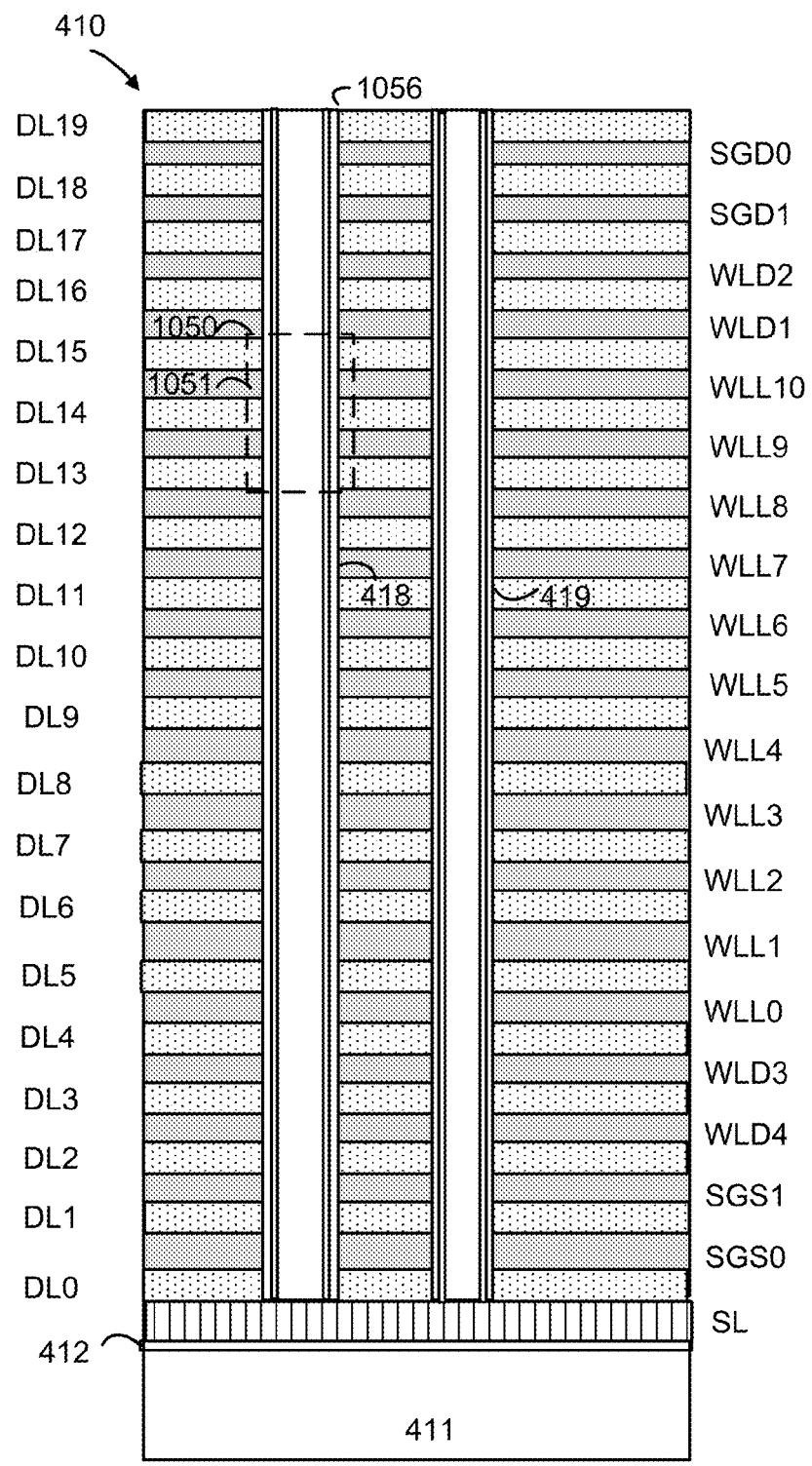
FIG. 10E depicts an example cross-sectional view of the stack of FIG. 10D after processing which is consistent with step 902 of FIG. 9A.

FIG. 10E depicts an example cross-sectional view of the stack of FIG. 10D after processing which is consistent with step 902 of FIG. 9A. Materials 1056 are deposited in the memory holes. The materials can include a blocking oxide layer, a charge-trapping layer, a tunneling layer, a channel layer and a dielectric core. A region 1050 of the stack is discussed in connection with FIG. 11A. Sacrificial material 1051 of the control gate layers is depicted.

Figure 10F:
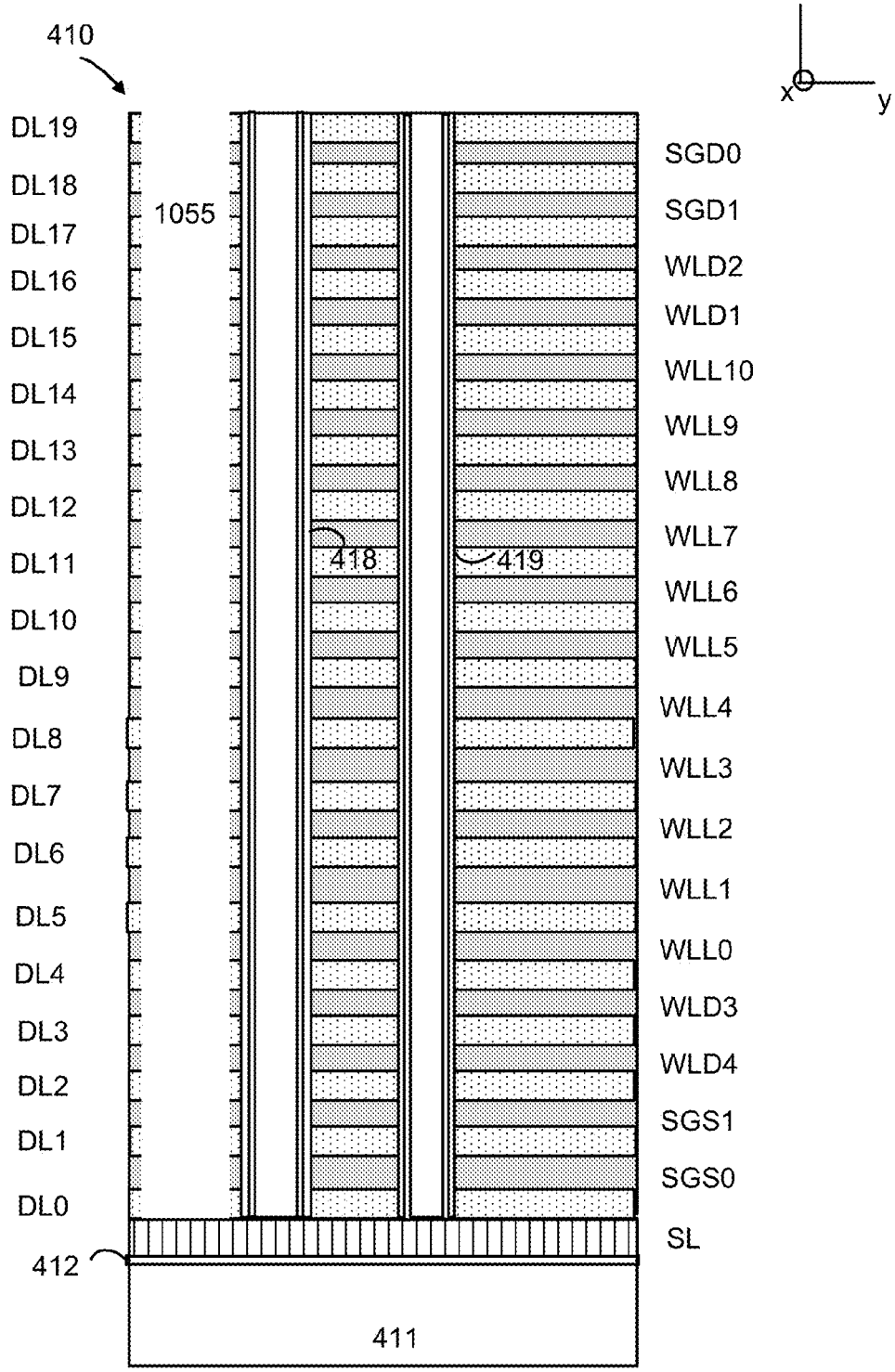
FIG. 10F depicts an example cross-sectional view of the stack of FIG. 10E after processing which is consistent with step 903 of FIG. 9A.

FIG. 10F depicts an example cross-sectional view of the stack of FIG. 10E after processing which is consistent with step 903 of FIG. 9A. Step 903 includes etching a slit 1055, e.g., an additional opening, in the stack. Slits may extend along the z-axis and the x-axis along the stack.

Figure 10G:
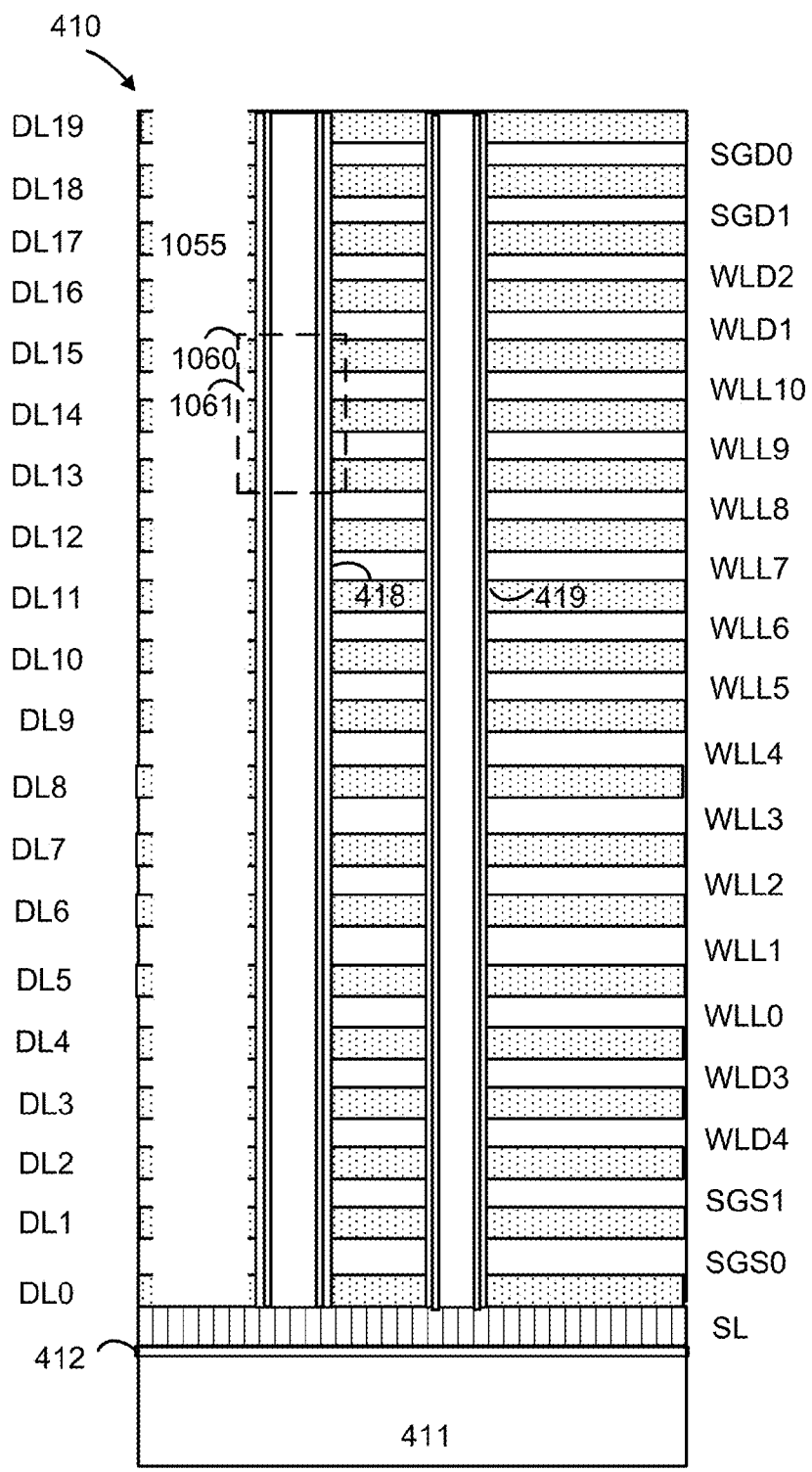
FIG. 10G depicts an example cross-sectional view of the stack of FIG. 10F after processing which is consistent with step 904 of FIG. 9A.

FIG. 10G depicts an example cross-sectional view of the stack of FIG. 10F after processing which is consistent with step 904 of FIG. 9A. Step 904 includes providing an etchant in the slit to remove the sacrificial material 1051 of the control gate layers, forming voids and exposing portions of the blocking oxide layer. Voids 1061 of the control gate layers are depicted. A region 1060 of the stack is discussed in connection with FIG. 11B.

Figure 10H:
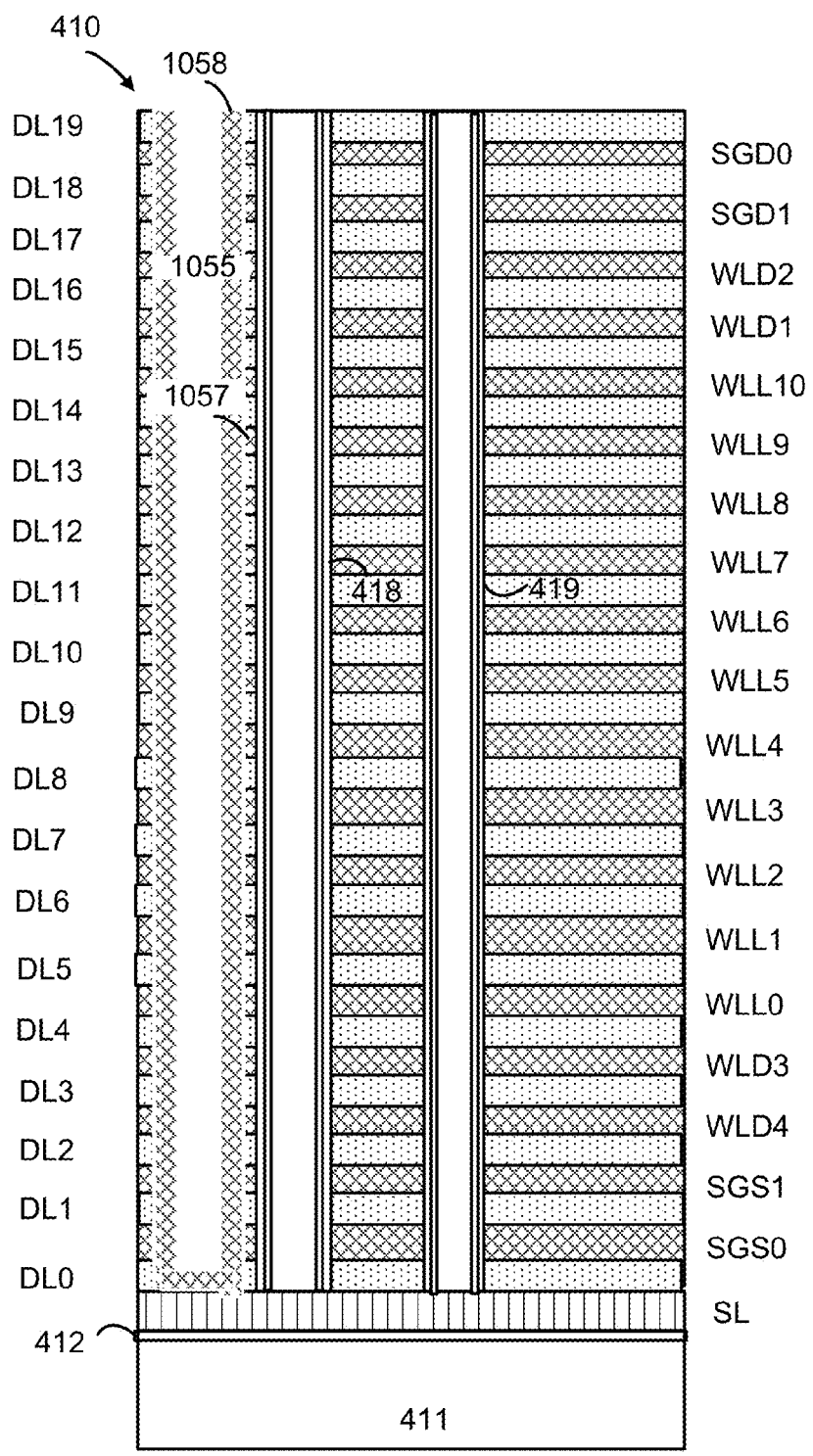
FIG. 10H depicts an example cross-sectional view of the stack of FIG. 10F after processing which is consistent with step 905 of FIG. 9A.

FIG. 10H depicts an example cross-sectional view of the stack of FIG. 10F after processing which is consistent with step 905 of FIG. 9A. Step 905 includes providing a metal for the control gate layer via the slit. The metal includes portions such as the portion 1057 which fills the voids of the control gate layers, and a liner 1058 which lines the slit. The stack of FIG. 4 is then obtained by cleaning and filling in the slit. The metal which lines the slit is cleaned away to avoid short circuiting the control gate layers. After the cleaning, the liner is deposited in the slit and the bottom of the liner is etched through. An adhesion layer such as titanium nitride (TiN) may be deposited before the metal 459 (FIG. 4). The metal forms a continuous conductive path from a bottom of the stack to the top of the stack and can therefore act as a local interconnect. The interconnect 417 is thus formed (FIG. 4). The interconnect can electrically connect a conductive path below the stack to a conductive path above the stack.

Figure 11A:
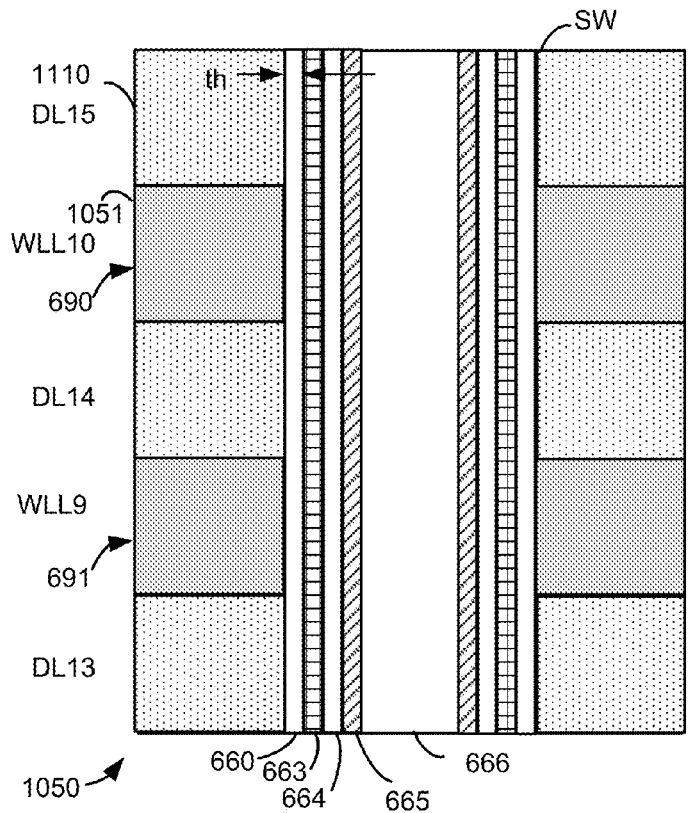
FIG. 11A depicts the region 1050 of the stack of FIG. 10E.

FIG. 11A depicts the region 1050 of the stack of FIG. 10E. The region includes the dielectric layers DL13, DL14 and DL15 (including dielectric material 1110) and the control gates 691 and 690 in the word line layers WLL9 and WLL10, respectively. A sidewall SW of the memory hole is also depicted. A blocking oxide layer 660, with a thickness th, is deposited on the sidewall followed by a charge-trapping layer 663, a tunneling oxide layer 664, a channel layer 665 and a dielectric core 666.

Figure 11B:
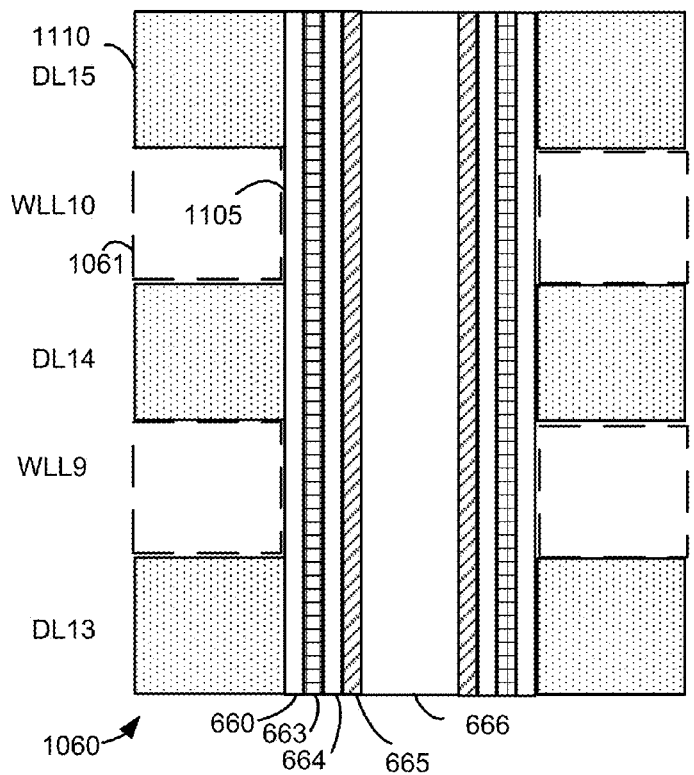
FIG. 11B depicts the region 1060 of the stack of FIG. 10G.

FIG. 11B depicts the region 1060 of the stack of FIG. 10G. Voids, e.g., void 1061, are formed in the control gate layers after the sacrificial material is removed using an etchant. The etchant also contacts portions, e.g., portion 1105, of the blocking oxide layer, etching the layer and reducing its thickness. The amount of etching is proportional to the amount of time the etchant is in contact with the blocking oxide layer. Since the etchant is supplied from the top of the slit and travels laterally and downward, the memory holes which are relatively closer to a slit from which the etchant is supplied will experience a relatively high level of etching. Portions of the blocking oxide layer which are relatively closer to the top of the memory hole may also experience a relatively high level of etching.

Figure 12A:
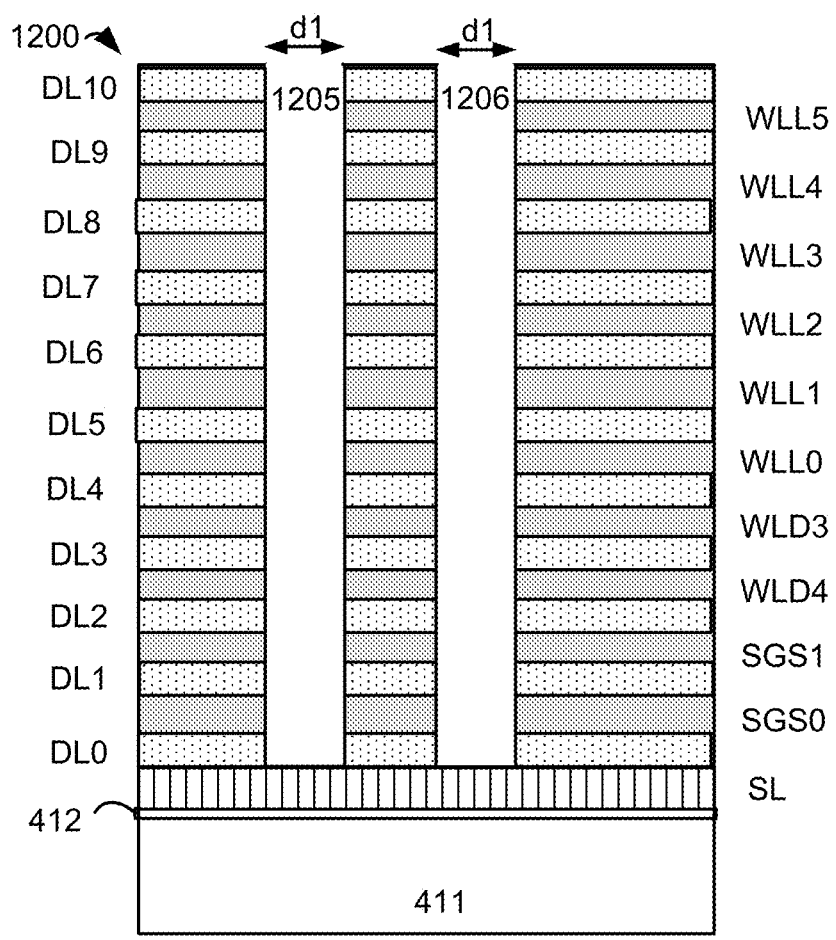
FIG. 12A depicts an example cross-sectional view of a stack of a memory device during a fabrication process consistent with steps 920 and 921 of FIG. 9C, where a lower portion of the stack includes alternating dielectric and control gate layers, and memory holes are etched in the lower portion of the stack.

FIG. 12A depicts an example cross-sectional view of a stack of a memory device during a fabrication process consistent with steps 920 and 921 of FIG. 9C, where a lower portion of the stack includes alternating dielectric and control gate layers, and lower memory hole portions 1205 and 1206 are etched in the lower portion of the stack. Step 920 includes forming a lower portion 1200 of a stack comprising alternating dielectric layers and control gate layers on a substrate. Step 921 includes etching memory holes with a common diameter (d1) in the lower portion of the stack, in one approach. A common diameter may be acceptable for the lower portion of the stack because the variation in the thickness of the blocking oxide layer at the lower portion of the stack as a function of distance from the local interconnect is expected to be less than the variation in the thickness of the blocking oxide layer at the upper portion of the stack as a function of distance from the local interconnect. This is due to the fact that the etchant is supplied from the top of the stack. Providing a common diameter for the lower portion of the stack can reduce the complexity of the fabrication process.

In this example, the lower portion of the stack includes dielectric layers DL0 to DL10 and control gate layers SGS0, SGS1, WLD4, WLD3, WLL0, WLL1, WLL2, WLL3, WLL4 and WLL5. As mentioned in connection with FIG. 5, the diameter of a memory hole can vary due to the etching process, and is often wider at the top than at the bottom. When referring to the diameter of a memory hole, one possibility is to refer to the diameter at the top of the hole. Another possibility is to refer to the diameter at the widest point of the hole, where the widest point may or may not be at the top. Generally, when referring to the relative diameters of different memory holes, the diameters should be defined at a common point along the hole, e.g., a common height in the stack, so that a meaningful comparison of memory hole sizes can be described. The diameter may be a representative diameter or a diameter metric. Further, the memory holes are not necessarily exactly circular in cross section but can have other shapes. The diameter can represent a width or similar size metric of a memory hole.

Figure 12B:
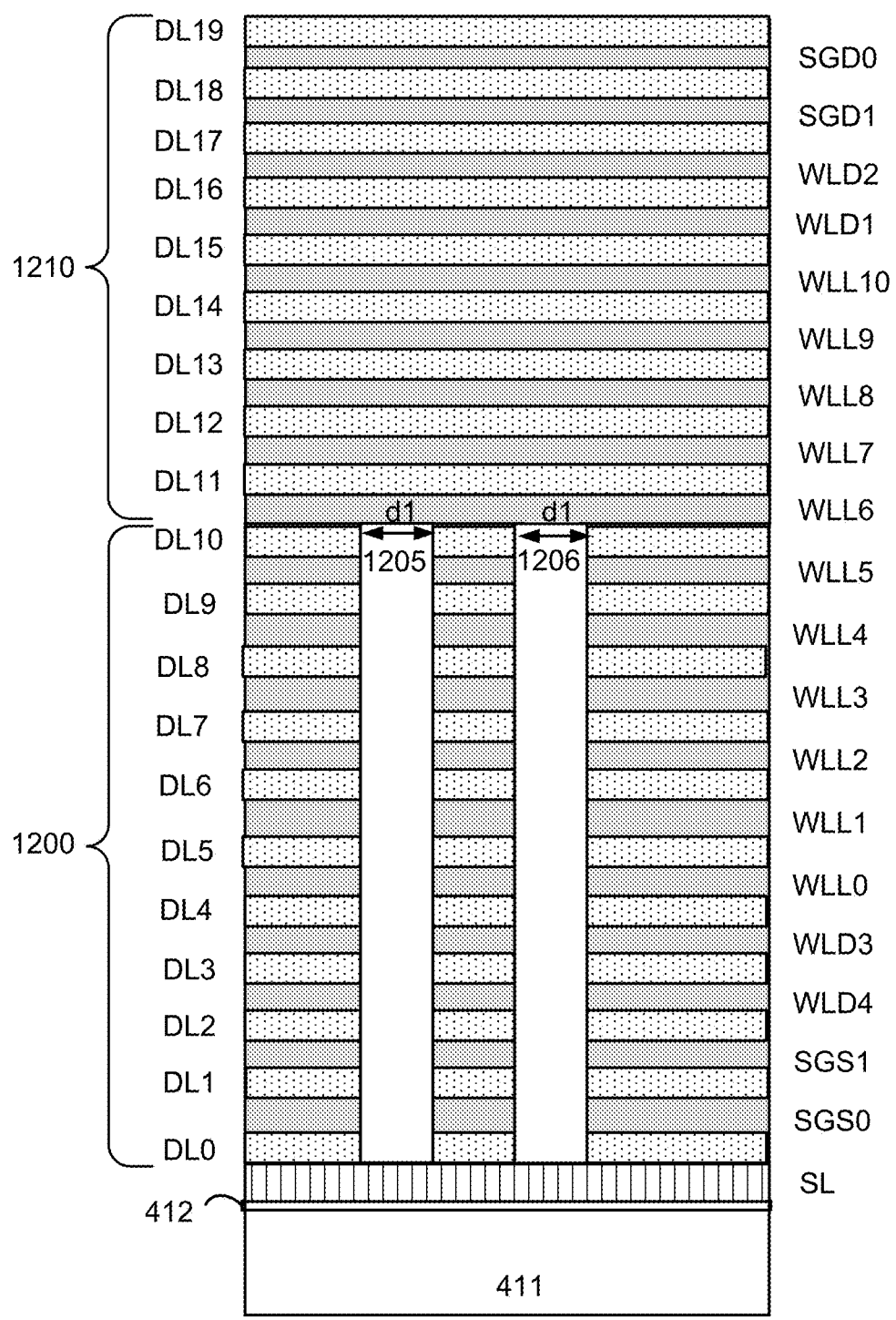
FIG. 12B depicts an example cross-sectional view of the stack of FIG. 12A after processing which is consistent with step 922 of FIG. 9C.

FIG. 12B depicts an example cross-sectional view of the stack of FIG. 12A after processing which is consistent with step 922 of FIG. 9C. Step 922 includes forming an upper portion 1210 of the stack comprising alternating dielectric layers and control gate layers on the lower portion of the stack. In this example, the upper portion of the stack includes dielectric layers DL11 to DL19 and control gate layers WLL6, WLL7, WLL8, WLL9, WLL10, WLD1, WLD2, SGD1 and SGD0. Optionally, the memory films and core dielectric are provided in the lower portion before forming the upper portion of the stack.

Figure 12C:
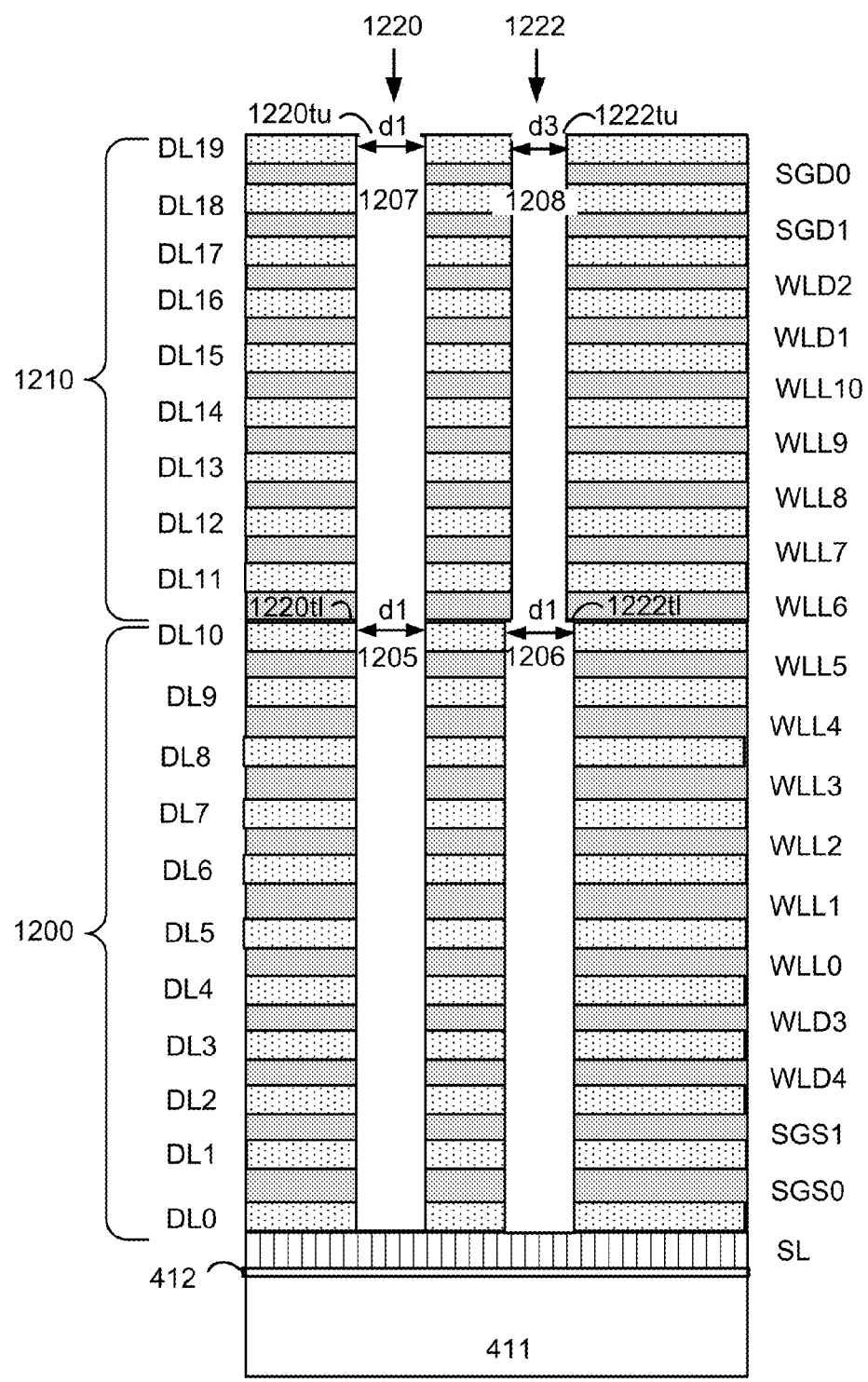
FIG. 12C depicts an example cross-sectional view of the stack of FIG. 12B after processing which is consistent with step 923 of FIG. 9C.

FIG. 12C depicts an example cross-sectional view of the stack of FIG. 12B after processing which is consistent with step 923 of FIG. 9C. The cross-sectional view is taken along line 1365 in FIG. 13D. Step 923 includes etching memory hole portions 1207 and 1208 with different diameters in the upper portion of the stack. In this case, the diameters of the memory hole portions 1207 and 1208 in the upper portion of the stack are d1 and d3, respectively. The diameter d1 of the upper memory hole portion 1207 in the upper portion of the stack is the same as the diameter d1 of the lower memory hole portion 1205 in the lower portion of the stack. The diameter d3 of the upper memory hole portion 1208 in the upper portion is smaller than the diameter d1 of the memory hole portion 1206 in the lower portion of the stack. A complete memory hole 1220 is formed from the lower and upper memory hole portions 1205 and 1207, respectively, and a complete memory hole 1222 is formed from the lower and upper memory hole portions 1206 and 1208, respectively.

Figure 12D:
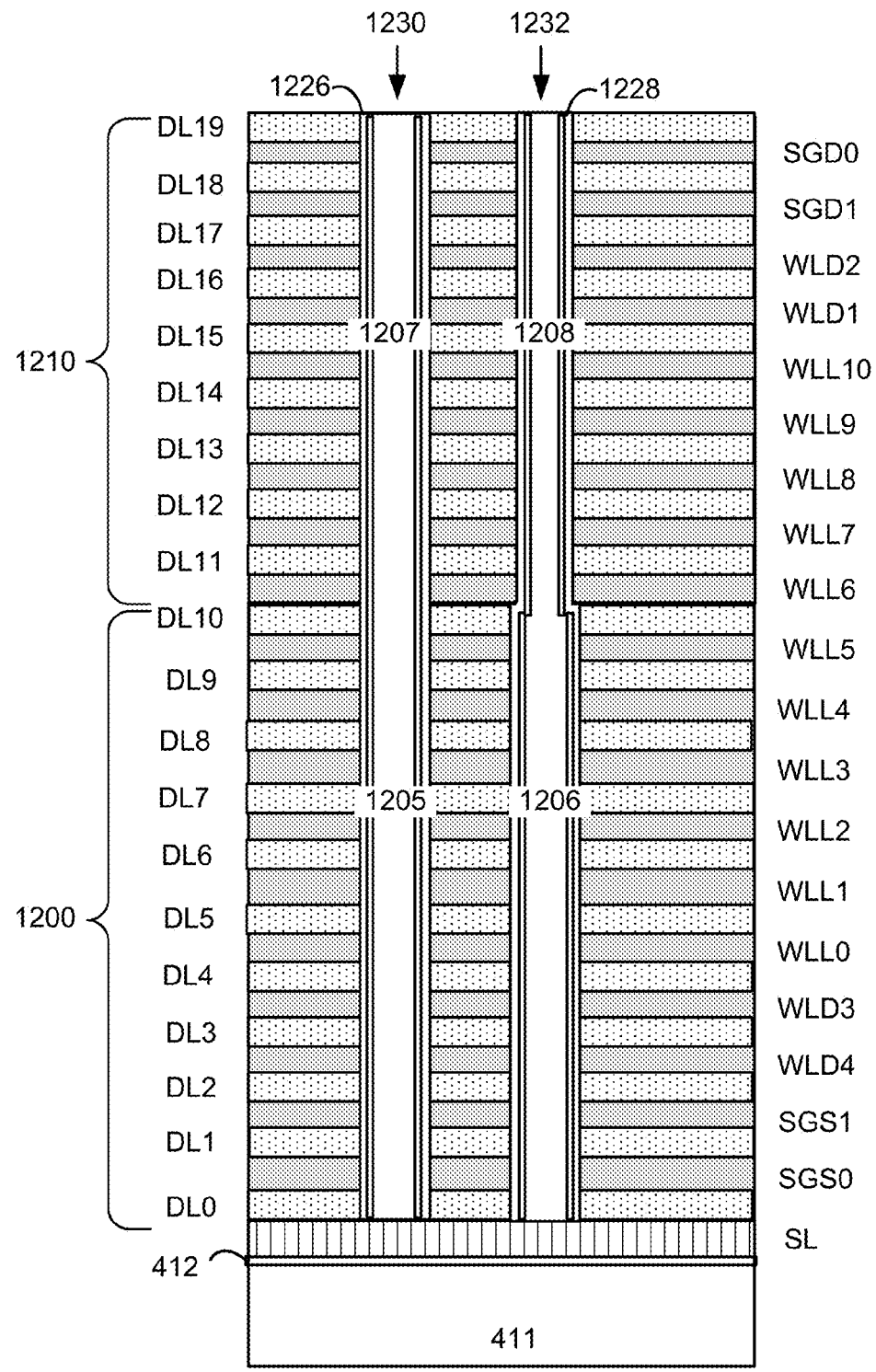
FIG. 12D depicts an example cross-sectional view of the stack of FIG. 12C after processing which is consistent with step 924 of FIG. 9C.

FIG. 12D depicts an example cross-sectional view of the stack of FIG. 12C after processing which is consistent with step 924 of FIG. 9C. Step 924 includes depositing memory films 1226 and 1228 (e.g., a blocking oxide layer, a charge-trapping layer, a tunnel oxide and a channel layer) along the sidewalls of the memory holes. A dielectric core filler is subsequently deposited. Memory holes 1230 and 1232, or pillars, are formed.

Each memory hole 1230 or 1232 of a set of memory holes comprises a lower portion 1205 or 1206 of the memory hole below an upper portion 1207 or 1208 of the memory hole; a diameter d1 of the lower portion of the memory hole is common in the set of memory holes; and a diameter of each memory hole of the set of memory holes which is relatively larger when the distance of the memory hole of the set of memory holes from the local interconnect is relatively smaller, comprises a diameter d1 or d3 of the upper portion of the memory hole. Further, the diameter of the lower portion of the memory hole is a diameter at the top 1220$t1$ or 1222$t1$ of the lower portion of the memory hole; and the diameter of the upper portion of the memory hole is a diameter at the top 1220$tu$ or 1222$tu$ of the upper portion of the memory hole.

Figure 12E:
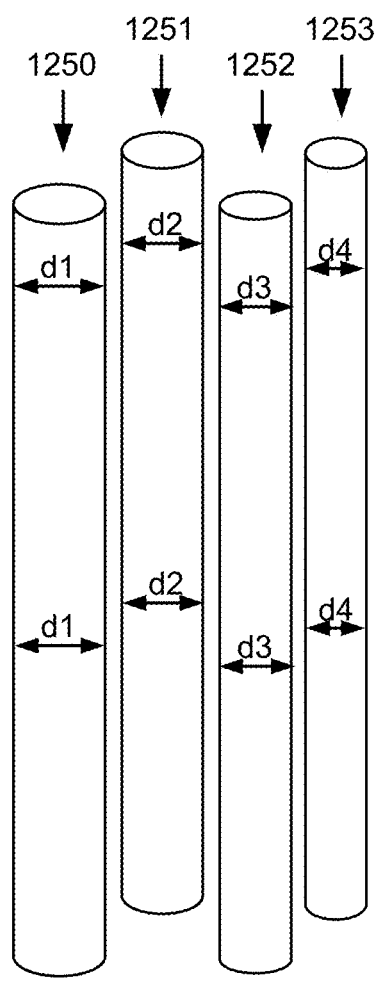
FIG. 12E depicts example pillars in a memory device consistent with FIGS. 4 and 13A.

FIG. 12E depicts example pillars in a memory device consistent with FIGS. 4 and 13A. In this case, each pillar has a common diameter in its top and bottom portions. Further, the pillars have progressively smaller diameters as their distance from a local interconnect becomes larger. Specifically, the memory holes or pillars 1250, 1251, 1252 and 1253 have diameters of d1, d2, d3 and d4, respectively, in both their top and bottom portions.

Figure 12F:
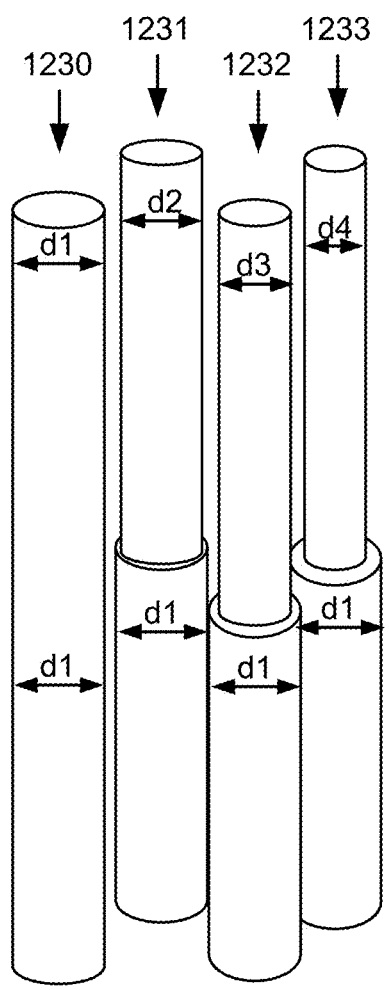
FIG. 12F depicts example pillars in a memory device consistent with FIGS. 12D and 13A.

FIG. 12F depicts example pillars in a memory device consistent with FIGS. 12D and 13A. The pillars 1230, 1231, 1232 and 1233 have the progressively smaller diameters of d1, d2, d3 and d4, respectively, in their top portions, and a common diameter of d1 in their bottom portions.

FIG. 13A depicts an example top view of a memory device portion 1300 consistent with FIG. 4 and FIG. 9A to 9C, where the memory holes have diameters which are inversely proportional to a distance from a local interconnect, and the memory holes are in staggered rows. The top view may depict the dielectric layer DL19, for example, of FIG. 4. The stack extends between local interconnects 1301 and 1302. The memory device has a left portion 1300L and a right portion 1300R. In this example, a row of dummy memory holes 1303 is provided between the left and right hand portions.

The stack may extend further in the x-y plane. In this example, there are eight rows of memory holes. Four rows R1L, R2L, R3L and R4L are in the left hand portion, at distances of y1, y2, y3 and y4, respectively, from the local interconnect 1301. Four rows R1R, R2R, R3R and R4R are in the right hand portion, at distances of y1, y2, y3 and y4, respectively, from the local interconnect 1302. Generally, the distance of a memory hole from the closest local interconnect is relevant as this interconnect represents the location of the slit used to supply all or most of the etchant to the memory hole. Example memory holes 1310, 1311, 1312 and 1313 have diameters of d1, d2, d3 and d4, respectively. The memory holes 1310 to 1313 may correspond to the pillars 1250 to 1253, respectively, in FIG. 12E, and to the pillars 1230 to 1233, respectively, in FIG. 12F. The left and right hand portions of the memory device of FIG. 13A are symmetric, as an example.

This example includes a total of eight rows of memory cells between adjacent local interconnects or slits. Other approaches are possible as well. For example, sixteen or more rows are possible. Controlling the memory hole size become even more important as the number of rows increases. Each row may represent a set of memory cells which extend parallel to a local interconnect. That is, a line which extends through the middle of each memory hole in a row may be parallel to a line which extends longitudinally in the interconnect.

The memory holes in the left portion 1300L comprise a set of memory holes 1316L which extend through the stack, where each memory hole of the set of memory holes comprises a sidewall, and along the sidewall, a blocking oxide layer followed by a charge trapping layer, a tunnel oxide layer and a polysilicon channel layer. Further, the memory holes of the set of memory holes are at different distances from the local interconnect 1301, and each memory hole of the set of memory holes has a diameter d1, d2, d3 or d4 which is relatively larger when a distance y1, y2, y3 or y4, of the memory hole of the set of memory holes from the local interconnect is relatively smaller.

The plurality of layers extend from the local interconnect 1301 of the stack to an additional local interconnect 1302 of the stack which is parallel to the local interconnect 1301, and the additional local interconnect extends through the stack. A first portion 1300L of the plurality of layers is adjacent to the local interconnect 1301. A second portion 1300R of the plurality of layers is adjacent to the additional local interconnect 1302. The set of memory holes 1316L is in the first portion of the plurality of layers. An additional set of memory holes 1316R is in the second portion of the plurality of layers. Each memory hole of the additional set of memory holes has a diameter d1, d2, d3 or d4 which is relatively larger when a distance y1, y2, y3 or y4 of the memory hole of the additional set of memory holes from the additional local interconnect is relatively smaller.

The memory holes are arranged in at least a first row R1L and a second row R2L which are parallel to the local interconnect 1316L, a distance y1 between the first row and the local interconnect is less than a distance y2 between the second row and the local interconnect, and a diameter d1 of the memory holes arranged in the first row is larger than a diameter d2 of the memory holes arranged in the second row.

The memory holes are arranged in a plurality of rows R1L to R4L which are parallel to the local interconnect 1301, in the plurality of rows, memory holes in a row R4L furthest from the local interconnect have a smallest diameter d4 and memory holes in a row R1L closest to the local interconnect have a largest diameter d1, and the largest diameter is at least 5-10% larger than the smallest diameter.

A method for fabricating a memory device comprises alternatingly depositing control gate sacrificial layers and dielectric layers on a substrate to form a stack; etching a first row R1L of memory holes through the stack, each memory hole of the first row of memory holes comprises a sidewall and has a first diameter d1 at a top of the memory hole; etching a second row R2L of memory holes through the stack, each memory hole of the second row of memory holes comprises a sidewall and has a second diameter d2 at a top of the memory hole, wherein the first diameter is greater than the second diameter; and for each memory hole of the first row of memory holes and each memory hole of the second row of memory holes, providing along the sidewall, a blocking oxide layer followed by a charge trapping layer, a tunnel oxide layer and a polysilicon channel layer.

An apparatus comprises: a plurality of control gate layers which are vertically spaced apart from one another by dielectric layers in a stack, the stack comprising a plurality of edges 1305*a*, 1305*b*, 1305*c* and 1305*d* which define a perimeter of the stack; a first row R1L of memory holes which extend through the stack, each memory hole of the first row of memory holes comprises a first diameter d1 at a top of the memory hole; and a second row R2L of memory holes which extend through the stack, each memory hole of the second row of memory holes comprises a second diameter d2 at a top of the memory hole. The first diameter is greater than the second diameter; the first row of memory holes is parallel to an edge 1305d of the plurality of edges; the second row of memory holes is parallel to the edge; and a distance y1 between the first row of memory holes and the edge is less than a distance y2 between the second row of memory holes and the edge.

FIG. 13B depicts example bit line connections in the top view of a memory device of FIG. 13A. Each line in the y-direction represents a bit line and each X represents a connection of a bit line to the top of a memory hole or pillar. In this approach, a bit line is shared by memory holes in the left and right hand portions of the memory device, but separate SGD layer are provided for the left portion 1300L and the right portion 1300R to select one of the two memory holes connected to a common bit line for programming at a given time. In another approach, each memory hole shown has its own bit line, and a common SGD layer can be used for the left portion 1300L and the right portion 1300R. Other configurations are possible as well. For example, more than two memory holes can share a bit line in the region of a memory device which is between two local interconnects.

FIG. 13C depicts a top view of a memory device in which the pattern of FIG. 13A is repeated. The memory device 1350 includes memory device portions 1300, 1320 and 1340, along with local interconnects 1301, 1302, 1321 and 1322. Each memory device portion includes a set of memory holes or pillars arranged in a similar pattern, in this example.

FIG. 13D depicts an example top view of a memory device 1370 consistent with FIG. 4 and FIG. 9A to 9C, where the memory holes have diameters which are inversely proportional to a distance from a local interconnect, and the memory holes are in aligned rows. The top view may depict the dielectric layer DL19, for example, of FIG. 4. The dielectric layer depicted, as well as the dielectric layers and control gate layers below it, extend between local interconnects 1371 and 1372. The memory device has a left portion 1380L and a right portion 1380R. In this example, a row of dummy memory holes 1366 is provided between the left and right hand portions.

In this example, there are eight rows of memory holes. Four rows R1L, R2L, R3L and R4L are in the left hand portion, at distances of y1, y2, y3 and y4, respectively, from the local interconnect 1371. Four rows R1R, R2R, R3R and R4R are in the right hand portion, at distances of y1, y2, y3 and y4, respectively, from the local interconnect 1372. Example memory holes 1360, 1361, 1362 and 1363 have diameters of d1, d2, d3 and d4, respectively. The left and right hand portions of the memory device of FIG. 13D are symmetric, as an example.

The fabrication process may be easier when the memory holes are in aligned rows. In the case of staggered rows, the density of memory holes may be increased.

FIG. 14A depicts an example of a photomask 1400 for use in providing the memory device of FIG. 13A, where the openings in the photomask have diameters which are inversely proportional to a distance of the corresponding memory holes from a local interconnect. The mask has circular openings with different diameters, and there are no edge modifications to the openings, in this example. The openings 1401, 1402, 1403 and 1404 correspond to the memory holes 1310, 1311, 1312 and 1313, respectively, in FIG. 13A. The diameters d1, d2, d3 and d4 of the openings 1401, 1402, 1403 and 1404, respectively, are the same as the diameters of the corresponding memory holes 1310, 1311, 1312 and 1313, respectively, as a simplification. In practice, depending on the lithography equipment used, the diameters or other dimensions of the openings of the mask can be larger or smaller than the corresponding dimensions of the memory holes which are provided by the openings.

FIG. 14B depicts an example of a photomask 1410 for use in providing the memory device of FIG. 13A, where the openings in the photomask are circular and have edge modifications based on a distance from a local interconnect. The edge modification in this example is an inwardly extending tab in the opening. The edge modification is a type of optical proximity correction. It allows the memory hole diameter to be smaller than the diameter of the opening in the mask. For example, the openings 1411, 1412, 1413 and 1414, with diameters of d1, d2, d3 and d4, respectively, are used to provide the corresponding memory holes 1310, 1311, 1312 and 1313, respectively. The opening 1411 does not have an edge modification, while the opening 1412 has an edge modification 1415 with a dimension in the y-direction of d1-d2 (FIG. 14C). The opening 1412 comprises a circle with an edge modification which reduces the area of the circle. In one approach, the x-dimension, perpendicular to the y-direction, of the edge modification may be about 0.2-0.6×d1 and the y-dimension may be about 0.1-0.4×d1. The openings 1413 and 1414 also have edge modifications which are progressively larger in the y-direction so that the corresponding memory holes are progressively smaller.

FIG. 14C depicts the opening 1412 of FIG. 14B overlaid with a corresponding memory hole 1311 of FIG. 13A. This shows how the edge modification in the opening of the mask reduces the size of the memory hole from d1 to d2.

Figure 15A:
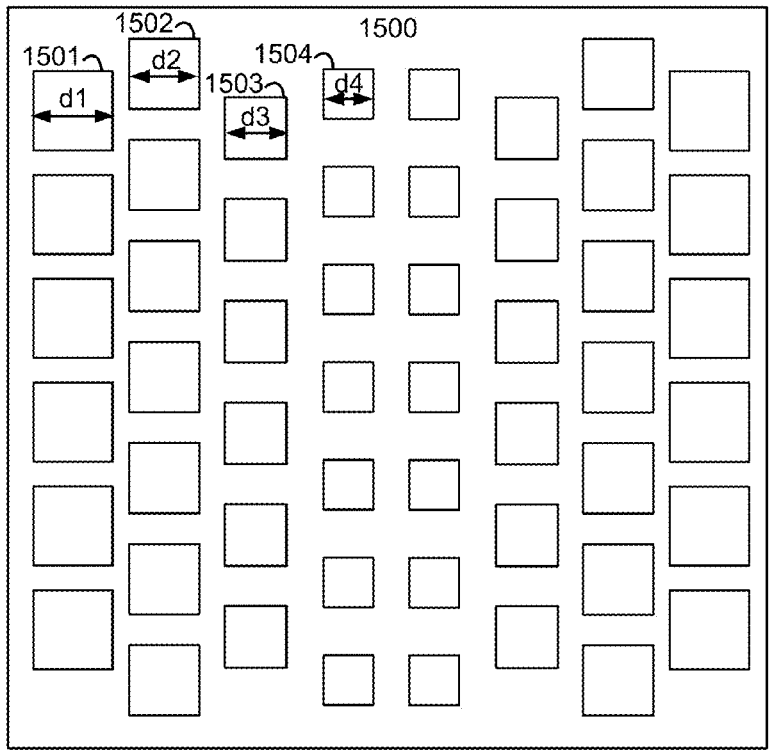
FIG. 15A depicts an example of a photomask for use in providing the memory device of FIG. 13A, where the openings in the photomask are rectangular and have widths which are inversely proportional to a distance from a local interconnect.

FIG. 15A depicts an example of a photomask 1500 for use in providing the memory device of FIG. 13A, where the openings in the photomask are rectangular and have widths which are inversely proportional to a distance from a local interconnect. The mask has rectangular, e.g., square, openings with different widths, and there are no edge modifications to the openings, in this example. The openings 1501, 1502, 1503 and 1504 correspond to the memory holes 1310, 1311, 1312 and 1313, respectively, in FIG. 13A. The widths d1, d2, d3 and d4 of the openings 1401, 1402, 1403 and 1404, respectively, are the same as the diameters of the corresponding memory holes 1310, 1311, 1312 and 1313, respectively, as a simplification.

Figure 15B:
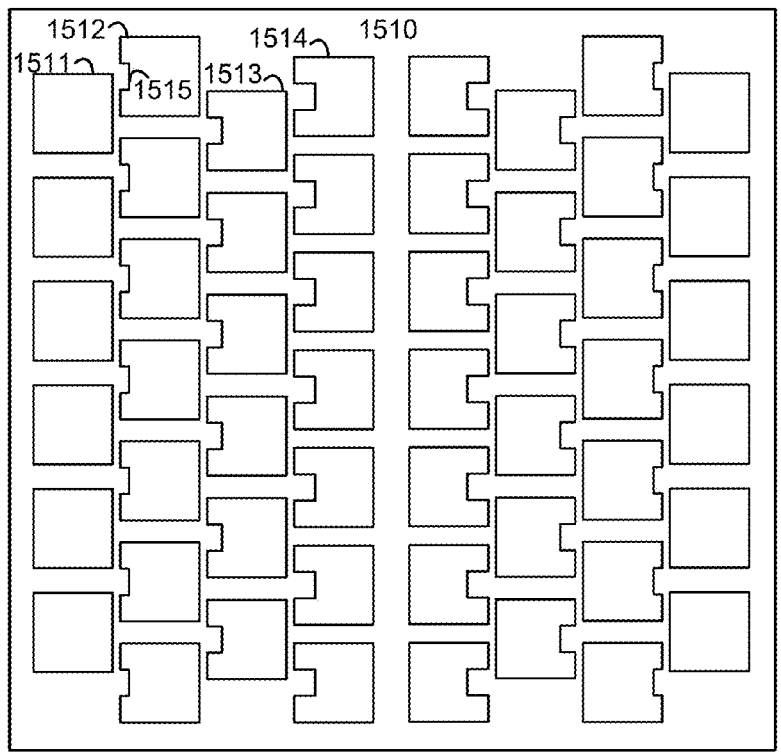
FIG. 15B depicts an example of a photomask for use in providing the memory device of FIG. 13A, where the openings in the photomask are rectangular and have edge modifications based on a distance from a local interconnect.
Figure 15C:
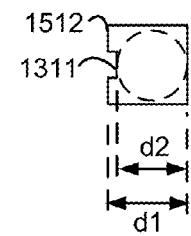
FIG. 15C depicts the opening 1512 of FIG. 15B overlaid with a corresponding memory hole 1311.

FIG. 15B depicts an example of a photomask 1510 for use in providing the memory device of FIG. 13A, where the openings in the photomask are rectangular and have edge modifications based on a distance from a local interconnect. The edge modification in this example is an inwardly extending tab in the opening. The openings 1511, 1512, 1513 and 1514, with widths of d1, d2, d3 and d4, respectively, are used to provide the corresponding memory holes 1310, 1311, 1312 and 1313, respectively. The opening 1511 does not have an edge modification, while the opening 1512 has an edge modification 1515 with a dimension in the y-direction of d1-d2 (FIG. 15C). The opening 1512 comprises a rectangle with an edge modification which reduces the area of the rectangle. In one approach, the x-dimension of the edge modification or tab may be about 0.2-0.6×d1 and the y-dimension may be about 0.1-0.4×d1. The openings 1413 and 1414 also have edge modifications which are progressively larger in the y-direction so that the corresponding memory holes are progressively smaller.

FIG. 15C depicts the opening 1512 of FIG. 15B overlaid with a corresponding memory hole 1311. The edge modification in the opening of the mask reduces the size of the memory hole from d1 to d2.

Figure 16:
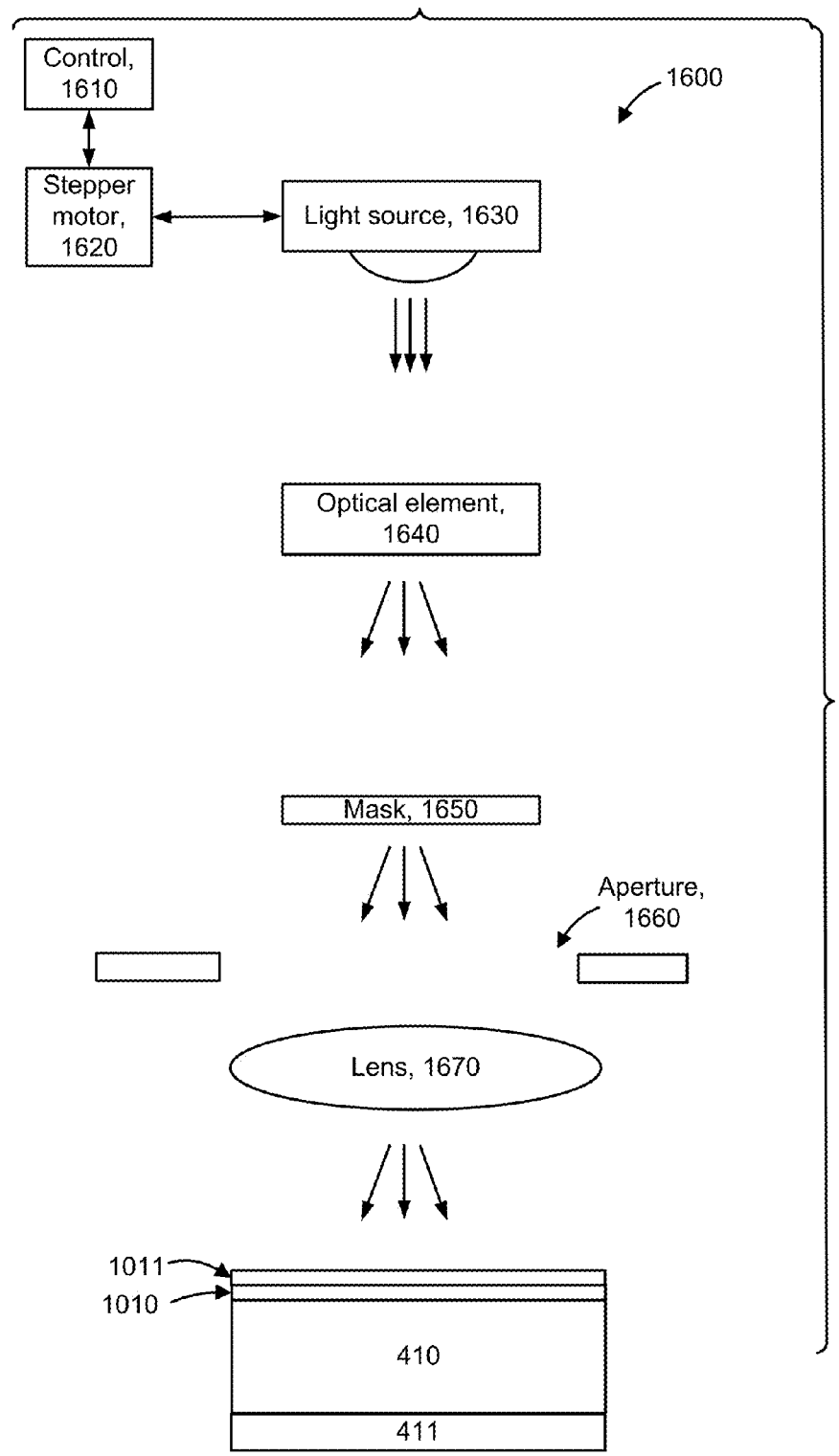
FIG. 16 depicts an example photolithographic apparatus for use in providing a memory device as described herein.

FIG. 16 depicts an example photolithographic apparatus 1600 for use in providing a memory device as described herein. The apparatus includes a control 1610, stepper motor 1620, light source 1630, optical element 1640, photomask 1650, aperture 1660 and projection lens 1670. A pattern of the photomask is transferred to a photoresist film 1011 (see also FIG. 10A). The photoresist film is on a hard mask layer 1010 which is on a stack 410 of alternating dielectric and control gate layers. The stack, in turn, is on a substrate 411 such as a wafer. The photoresist film has a predetermined thickness which is suitable for its intended application. In this simplified example, under control of the stepper motor, the light source and optical element move relative to the photomask, while the photoresist film is held in a fixed position in relation to the photomask. In particular, the light source and optical element expose portions of the photoresist film as they move across the pattern of the photomask.

The lens may provide reduction optics which reduces the incident light beam to cause an exposure pattern on the photoresist film corresponding to a pattern on the photomask. The photomask can be a chrome-less mask, chrome-on-glass mask or attenuating phase shifting mask, for example. The mask can be provided with a mask bias and phase angle which is optimum for its intended application.

Further, the photolithographic apparatus may use immersion lithography. In one approach, water is dispensed between the lens and the photoresist film, and surface tension results in a puddle on the photoresist film. Since the index of refraction (n) of water is n>1 (e.g., 1.47 for ultrapure water), a numerical aperture (NA) of >1 can be achieved. The lens in combination with the water puddle provide hyper-numerical aperture (NA>1) optics which can resolve a smaller feature width than the lens in air. An NA of approximately 1.0-1.5 may be used, for instance. In one possible implementation, the lithographic apparatus can be used to image memory holes in the stack.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of layers in a stack, the plurality of layers comprising word line layers which are vertically spaced apart from one another by dielectric layers, the plurality of layers are adjacent to a local interconnect of the stack, the local interconnect extends through the stack; and
a set of memory holes which extend through the stack, each memory hole of the set of memory holes comprises a sidewall, and along the sidewall, a blocking oxide layer followed by a charge trapping layer, a tunnel oxide layer and a polysilicon channel layer, wherein the memory holes of the set of memory holes have diameters which are progressively smaller as a distance between the memory holes and the local interconnect is progressively larger and widths of the blocking oxide layers are relatively smaller when the distances are relatively smaller.

2. The apparatus of claim 1, wherein:
the memory holes are arranged in at least a first row and a second row which are parallel to the local interconnect;
a distance between the first row and the local interconnect is less than a distance between the second row and the local interconnect; and
a diameter of the memory holes arranged in the first row is larger than a diameter of the memory holes arranged in the second row.

3. The apparatus of claim 1, wherein:
the memory holes are arranged in a plurality of rows which are parallel to the local interconnect;
in the plurality of rows, memory holes in a row furthest from the local interconnect have a smallest diameter and memory holes in a row closest to the local interconnect have a largest diameter; and
the largest diameter is at least 5-10% larger than the smallest diameter.

4. The apparatus of claim 1, wherein:
the plurality of layers extend from the local interconnect of the stack to an additional local interconnect of the stack which is parallel to the local interconnect, the additional local interconnect extends through the stack;
a first portion of the plurality of layers is adjacent to the local interconnect;
a second portion of the plurality of layers is adjacent to the additional local interconnect;
the set of memory holes is in the first portion of the plurality of layers;
an additional set of memory holes is in the second portion of the plurality of layers; and
each memory hole of the additional set of memory holes comprises a sidewall, and along the sidewall, a blocking oxide layer followed by a charge trapping layer, a tunnel oxide layer and a polysilicon channel layer, wherein the memory holes of the additional set of memory holes are at different distances from the additional local interconnect, and each memory hole of the additional set of memory holes has a diameter which is relatively larger when a distance of the memory hole of the additional set of memory holes from the additional local interconnect is relatively smaller.

5. The apparatus of claim 1, wherein:
each memory hole of the set of memory holes comprises a lower portion of the memory hole below an upper portion of the memory hole;
a diameter of the lower portion of the memory hole is common in the set of memory holes; and
the diameters which are progressively smaller as a distance between the memory holes and the local interconnect is progressively larger, comprises a diameter of the upper portion of the memory hole.

6. The apparatus of claim 5, wherein for each memory hole of the set of memory holes:
the diameter of the lower portion of the memory hole is a diameter at a top of the lower portion of the memory hole; and
the diameter of the upper portion of the memory hole is a diameter at a top of the upper portion of the memory hole.

7. The apparatus of claim 5, wherein:

in the upper portion of each memory hole of the set of memory holes, an average width of the blocking oxide layer is relatively smaller when the distance of the memory hole of the set of memory holes from the local interconnect is relatively smaller.

8. The apparatus of claim 7, wherein:

for each memory hole of the set of memory holes, an average width of the blocking oxide layer in the lower portion of the memory hole is wider than an average width of the blocking oxide layer in the upper portion of the memory hole.

9. The apparatus of claim 1, wherein:

for each memory hole of the set of memory holes, the diameter of the memory hole which is relatively larger when the distance of the memory hole of the set of memory holes from the local interconnect is relatively smaller, comprises a diameter at a top of the memory hole.

10. An apparatus, comprising:

a plurality of control gate layers which are vertically spaced apart from one another by dielectric layers in a stack, the stack comprising a plurality of edges which define a perimeter of the stack;

a first row of memory holes which extend through the stack, each memory hole of the first row of memory holes comprises a first diameter at a top of the memory hole; and a second row of memory holes which extend through the stack, each memory hole of the second row of memory holes comprises a second diameter at a top of the memory hole, wherein:

the first diameter is greater than the second diameter;

the first row of memory holes is parallel to an edge of the plurality of edges;

the second row of memory holes is parallel to the edge;

a distance between the first row of memory holes and the edge is less than a distance between the second row of memory holes and the edge;

each memory hole of the first row of memory holes and each memory hole of the second row of memory holes comprises a sidewall, and along the sidewall, a blocking oxide layer followed by a charge trapping layer, a tunnel oxide layer and a channel layer; and a width of the blocking oxide layer in the first row of memory holes is less than a width of the blocking oxide layer in the second row of memory holes.

11. The apparatus of claim 10, wherein:

the first diameter is greater than the second diameter by at least 5-10%.

* * * * *